US009293624B2

(12) United States Patent
Cudzinovic et al.

(10) Patent No.: US 9,293,624 B2
(45) Date of Patent: *Mar. 22, 2016

(54) METHODS FOR ELECTROLESS PLATING OF A SOLAR CELL METALLIZATION LAYER

(71) Applicant: SunPower Corporation, San Jose, CA (US)

(72) Inventors: Michael Cudzinovic, Sunnyvale, CA (US); Joseph Behnke, San Jose, CA (US)

(73) Assignee: SunPower Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/097,164

(22) Filed: Dec. 4, 2013

(65) Prior Publication Data
US 2014/0162399 A1 Jun. 12, 2014

Related U.S. Application Data

(60) Provisional application No. 61/956,175, filed on Dec. 10, 2012, provisional application No. 61/794,499, filed on Mar. 15, 2013.

(51) Int. Cl.
H01L 21/00 (2006.01)
H01L 31/068 (2012.01)
(Continued)

(52) U.S. Cl.
CPC ........ *H01L 31/0682* (2013.01); *C23C 18/1653* (2013.01); *C25D 5/10* (2013.01); *C25D 7/126* (2013.01); *H01L 31/022425* (2013.01); *H01L 31/0745* (2013.01); *Y02E 10/547* (2013.01)

(58) Field of Classification Search
CPC ................ H01L 31/0224; H01L 31/18; H01L 31/02168; H01L 31/022441; H01L 31/0682; C23C 18/1653; C25D 5/10; C25D 7/126; Y02E 10/547
USPC ............................................ 438/98; 136/256
See application file for complete search history.

(56) References Cited

U.S. PATENT DOCUMENTS

| 4,650,695 A | 3/1987 | Gregory |
| 6,429,037 B1 | 8/2002 | Wenham et al. |

(Continued)

FOREIGN PATENT DOCUMENTS

| DE | 195 25 720 | 1/1997 |
| WO | WO-2010-068050 | 6/2010 |

OTHER PUBLICATIONS

International Search Report and Written Opinion of the International Searching Authority dated Mar. 18, 2014, in International Patent Application No. PCT/US2013/073441.

(Continued)

Primary Examiner — Caleb Henry
(74) Attorney, Agent, or Firm — Blakely Sokoloff Taylor Zafman LLP

(57) ABSTRACT

A method for forming a contact region for a solar cell is disclosed. The method includes depositing a paste composed of a first metal above a substrate of the solar cell, curing the paste to form a first metal layer, electrolessly plating a second metal layer on the first metal layer and electrolytically plating a third metal layer on the second metal layer, where the second metal layer electrically couples the first metal layer to the third metal layer. The method can further include electrolytically plating a fourth metal layer on the third metal layer.

20 Claims, 25 Drawing Sheets

(51) Int. Cl.
*C25D 5/10* (2006.01)
*C23C 18/16* (2006.01)
*C25D 7/12* (2006.01)
*H01L 31/0224* (2006.01)
*H01L 31/0745* (2012.01)

(56) References Cited

U.S. PATENT DOCUMENTS

| | | | | |
|---|---|---|---|---|
| 8,551,866 | B2* | 10/2013 | Moslehi et al. | 438/478 |
| 8,722,196 | B2* | 5/2014 | Yae | C23C 18/1619 428/304.4 |
| 8,980,420 | B2* | 3/2015 | Yae | B82Y 30/00 428/131 |
| 9,028,982 | B2* | 5/2015 | Yae | C23C 18/1651 428/446 |
| 2002/0148499 | A1* | 10/2002 | Tanaka | 136/256 |
| 2004/0200520 | A1 | 10/2004 | Mulligan et al. | |
| 2006/0060238 | A1* | 3/2006 | Hacke et al. | 136/256 |
| 2007/0095389 | A1* | 5/2007 | Cho | H01G 9/2031 136/263 |
| 2008/0132082 | A1 | 6/2008 | Lopatin et al. | |
| 2008/0169349 | A1* | 7/2008 | Suzuki et al. | 235/492 |
| 2009/0139568 | A1* | 6/2009 | Weidman et al. | 136/256 |
| 2009/0283141 | A1* | 11/2009 | Bentzen et al. | 136/256 |
| 2010/0148318 | A1* | 6/2010 | Wang et al. | 257/627 |
| 2010/0175752 | A1* | 7/2010 | Wang | H01L 31/0236 136/256 |
| 2010/0218824 | A1* | 9/2010 | Luch | 136/256 |
| 2010/0229941 | A1 | 9/2010 | Matsui et al. | |
| 2010/0229942 | A1* | 9/2010 | Luch | 136/256 |
| 2011/0000530 | A1* | 1/2011 | Mihailetchi | 136/255 |
| 2011/0067754 | A1* | 3/2011 | Luch | 136/256 |
| 2011/0120518 | A1* | 5/2011 | Rust | 136/244 |
| 2011/0140226 | A1 | 6/2011 | Jin et al. | |
| 2011/0240119 | A1 | 10/2011 | Lee et al. | |
| 2011/0272013 | A1* | 11/2011 | Moslehi | 136/255 |
| 2011/0277825 | A1* | 11/2011 | Fu et al. | 136/255 |
| 2012/0125424 | A1 | 5/2012 | Wenham et al. | |
| 2012/0167969 | A1* | 7/2012 | Petti | 136/256 |
| 2012/0240998 | A1* | 9/2012 | Ballif | 136/256 |
| 2013/0000715 | A1* | 1/2013 | Moslehi et al. | 136/256 |
| 2013/0000718 | A1* | 1/2013 | Tsao | 136/256 |
| 2013/0125974 | A1* | 5/2013 | Kong et al. | 136/256 |
| 2013/0213469 | A1* | 8/2013 | Kramer et al. | 136/256 |
| 2013/0228221 | A1* | 9/2013 | Moslehi et al. | 136/256 |
| 2013/0247957 | A1* | 9/2013 | Hashigami et al. | 136/244 |
| 2013/0312827 | A1* | 11/2013 | Adachi et al. | 136/256 |
| 2014/0020746 | A1* | 1/2014 | Lennon et al. | 136/256 |
| 2014/0060612 | A1* | 3/2014 | DiCenso et al. | 136/244 |
| 2014/0090701 | A1* | 4/2014 | Rim et al. | 136/256 |
| 2014/0162399 | A1* | 6/2014 | Cudzinovic | C25D 5/10 438/98 |
| 2014/0174518 | A1* | 6/2014 | Wu et al. | 136/256 |
| 2014/0179056 | A1* | 6/2014 | Morse | 438/97 |
| 2014/0261659 | A1* | 9/2014 | Babayan et al. | 136/256 |
| 2014/0261671 | A1* | 9/2014 | Zhu | 136/256 |
| 2014/0322860 | A1* | 10/2014 | Vais et al. | 438/98 |
| 2015/0020877 | A1* | 1/2015 | Moslehi et al. | 136/256 |
| 2015/0068583 | A1* | 3/2015 | Moslehi | 136/246 |

OTHER PUBLICATIONS

Extended European Search Report from European Patent Application No. 13862746.8 mailed Nov. 10, 2015, 6 pgs.

* cited by examiner

METHODS FOR ELECTROLESS PLATING OF A SOLAR CELL METALLIZATION LAYER

CROSS-REFERENCE TO RELATED APPLICATIONS

This application claims the benefit of U.S. Provisional Application No. 61/956,175, filed on Dec. 10, 2012, and U.S. Provisional Application No. 61/794,499, filed on Mar. 15, 2013, the entire contents of which are hereby incorporated by reference herein.

TECHNICAL FIELD

Embodiments of the subject matter described herein relate generally to solar cells. More particularly, embodiments of the subject matter relate to solar cell structures and fabrication processes.

BACKGROUND

Solar cells are well known devices for converting solar radiation to electrical energy. They can be fabricated on a semiconductor wafer using semiconductor processing technology. A solar cell includes P-type and N-type diffusion regions. Solar radiation impinging on the solar cell creates electrons and holes that migrate to the diffusion regions, thereby creating voltage differentials between the diffusion regions. In a backside contact solar cell, both the diffusion regions and the metal contact fingers coupled to them are on the backside of the solar cell. The contact fingers allow an external electrical circuit to be coupled to and be powered by the solar cell.

Techniques for improving contact formation and plating metal to a solar cell during manufacturing are very beneficial as these are an intrinsic part of the standard solar cell fabrication process. Such improved techniques may reduce fabrication operations and improve overall output yield, decreasing overall solar cell manufacturing time and increasing the available product yield due to less handling.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
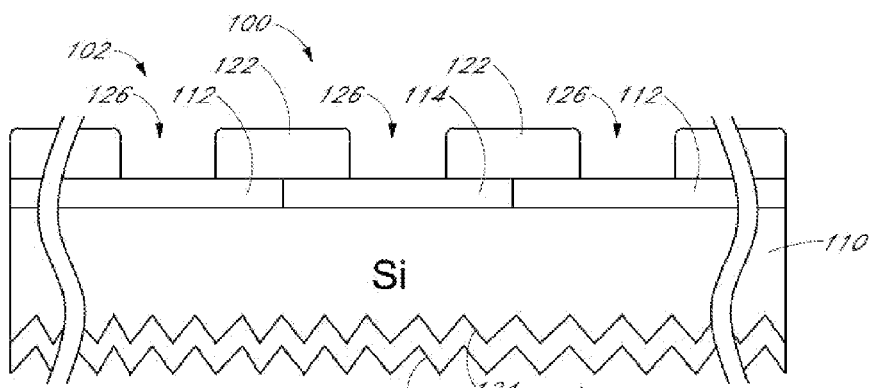
FIGS. 1-6 are cross-sectional representations of a solar cell in accordance with a standard solar cell fabrication process.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Additionally, numerous specific details are set forth, such as specific process flow operations, in order to provide a thorough understanding of the method and its embodiments. It will be apparent to one skilled in the art that the method and its embodiments may be practiced without these specific details. In other instances, well-known fabrication techniques, such as lithographic, etch and plating techniques, are not described in detail in order to not unnecessarily obscure the method and its embodiments. Furthermore, it is to be understood that the various embodiments shown in the figures are illustrative representations and are not necessarily drawn to scale.

A method for forming a contact region for a solar cell is disclosed. The method includes providing a solar cell having a front side configured to face the sun during normal operation, and a back side opposite the front side. The method also includes depositing a paste composed of a first metal above a substrate of the solar cell, curing the paste to form a first metal layer, electrolessly plating a second metal layer on the first metal layer and electrolytically plating a third metal layer on the second metal layer where the second metal layer electrically couples the first metal layer to the third metal layer. In an embodiment, depositing the paste above the substrate includes depositing paste on a polysilicon region above the substrate. In another embodiment, depositing the paste includes depositing an aluminum paste. In still another embodiment, depositing the aluminum paste includes depositing an aluminum paste having a thickness of at least 0.5 microns. In yet another embodiment, the second metal layer includes a barrier metal adapted to prevent diffusion of metals from the third metal layer into the substrate. In another embodiment, electrolessly plating the second metal layer includes electrolessly plating a metal such as, but not limited to, nickel, gold, silver, rhodium, chromium, zinc, tin or cadmium. In still another embodiment, electrolessly plating the second metal layer includes electrolessly plating a metal layer having a thickness of at least 0.1 microns. In yet another embodiment, electrolytically plating the third metal layer includes electrolytically plating a metal such as, but not limited to, copper, tin, aluminum, silver, gold, chromium, iron, nickel, zinc, ruthenium, palladium, or platinum.

Another method for forming a contact region for a solar cell is disclosed. The method includes providing a solar cell having a front side configured to face the sun during normal operation, and a back side opposite the front side. The method also includes depositing a paste composed of a first metal above a substrate of the solar cell, curing the paste to form a first metal layer, electrolessly plating a second metal layer on the first metal layer and electrolytically plating a third metal layer on the second metal layer where the second metal layer electrically couples the first metal layer to the third metal layer. In an embodiment, the method further includes electrolytically plating a fourth metal layer on the third metal layer. In another embodiment electrolytically plating the fourth metal layer includes electrolytically plating a metal such as, but not limited to, copper, tin, aluminum, silver, gold, chromium, iron, nickel, zinc, ruthenium, palladium, or platinum.

Yet another method for forming a contact region for a solar cell is disclosed. The method includes providing a solar cell having a front side configured to face the sun during normal operation, and a back side opposite the front side. The method also includes depositing, in an interdigitated pattern, an aluminum paste above a substrate of the solar cell, curing the aluminum paste to form a layer of aluminum, electrolessly plating a second metal layer with a thickness of at least 0.1 microns on the layer of aluminum, electrolytically plating a third metal layer on the second metal layer, where the second metal layer electrically couples the layer of aluminum to the third metal layer and electrolytically plating a fourth metal layer on the third metal layer. In an embodiment depositing aluminum paste includes depositing aluminum paste having a thickness of at least 0.5 microns. In another embodiment, the second metal layer includes a barrier metal adapted to prevent diffusion of metals from the third metal layer into the substrate. In still another embodiment, depositing aluminum paste above the substrate includes depositing aluminum paste on a polysilicon region above the substrate. In yet another embodiment, depositing the aluminum paste includes depositing using a method such as, but not limited to, screen printing, spin coating, or ink-jet printing. In an embodiment, electrolytically plating the third and fourth metal layers includes electrolytically plating metals such as, but not limited to, copper, tin, aluminum, silver, gold, chromium, iron, nickel, zinc, ruthenium, palladium, or platinum.

A method for forming a contact region for a solar cell is disclosed. The method includes providing a solar cell having a front side configured to face the sun during normal operation, and a back side opposite the front side. The method also includes depositing, in an interdigitated pattern, an aluminum paste with a thickness of at least 0.5 microns above a substrate of the solar cell, thermally curing the aluminum paste to form a layer of aluminum and electrolessly plating a second metal layer including a barrier metal with a thickness of at least 0.1 microns on the first metal layer, where the barrier metal is adapted to prevent diffusion of metals into the substrate. The method also includes electrolytically plating a third metal layer on the second metal layer, where the second metal layer electrically couples the layer of aluminum to the third metal layer and electrolytically plating a fourth metal layer on the third metal layer. In an embodiment, depositing aluminum paste above the substrate includes depositing aluminum paste on a polysilicon region above the substrate. In another embodiment, depositing an aluminum paste on the solar cell includes depositing aluminum paste on the solar cell using a method such as, but not limited to, screen printing, spin coating, or ink-jet printing. In still another embodiment, providing a solar cell includes providing a solar cell such as, but not limited to, a back-contact solar cell, front-contact solar, monocrystalline silicon solar cells, polycrystalline silicon solar cells, amorphous silicon solar cells, thin film silicon solar cells, copper indium gallium selenide (CIGS) solar cells, and cadmium telluride solar cells.

Figure 2:
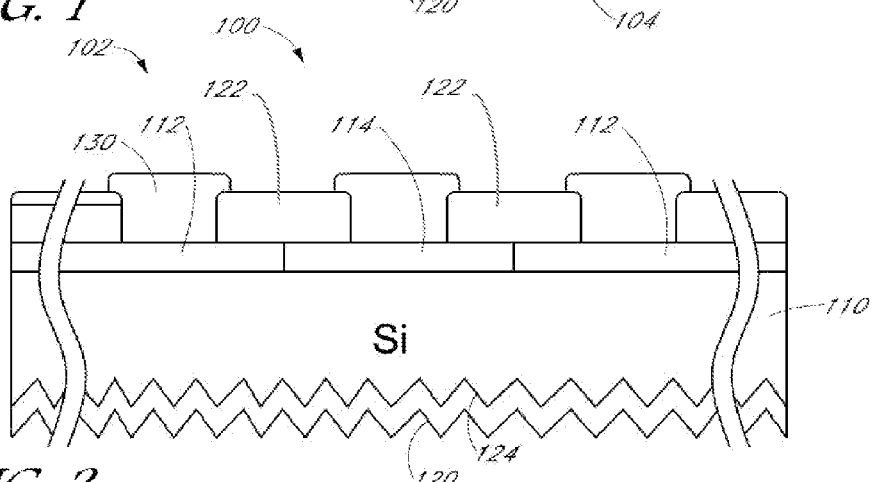
Figure 3:
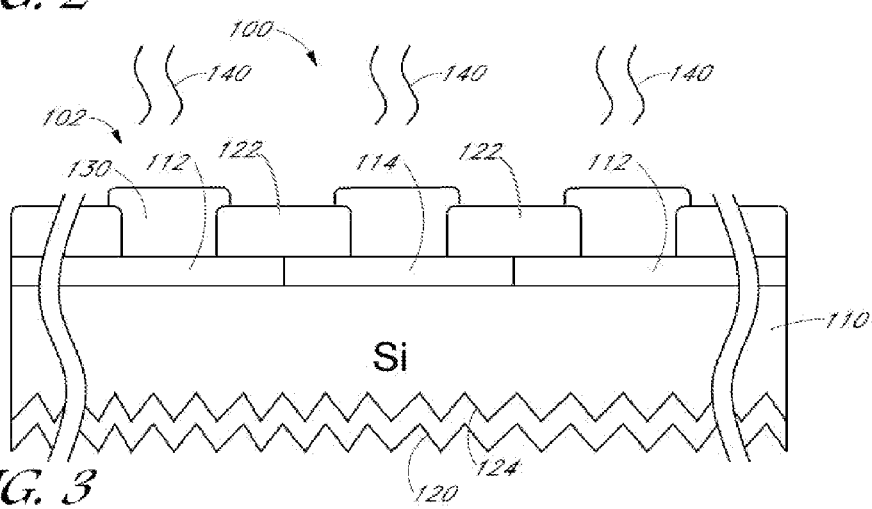
Figure 4:
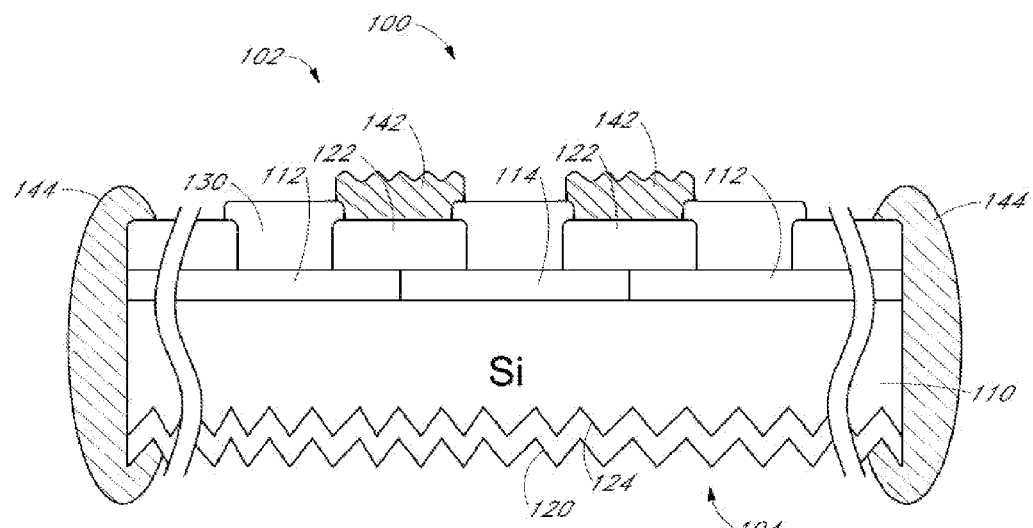
Figure 5:
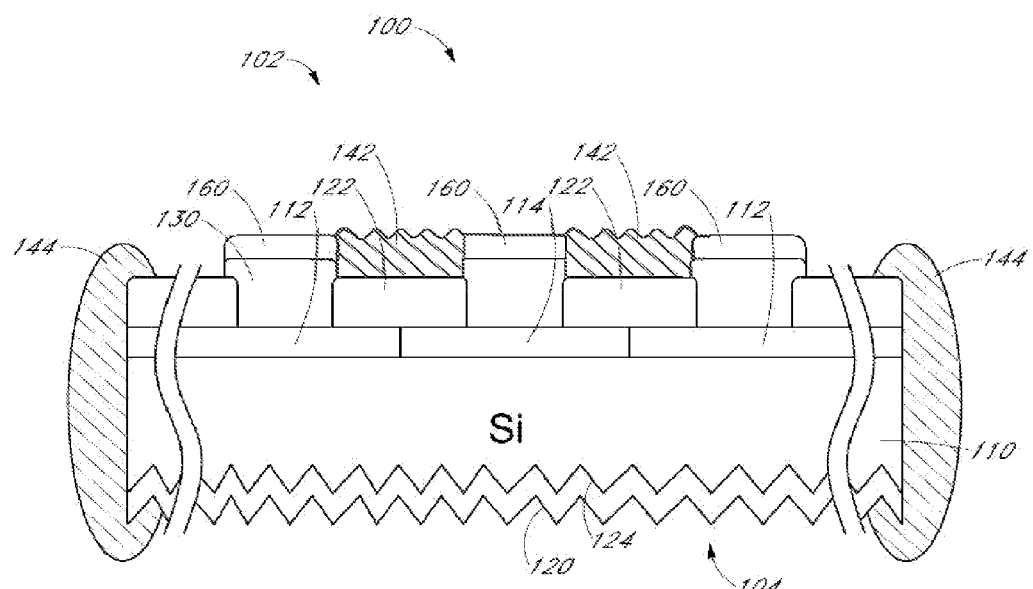
Figure 6:
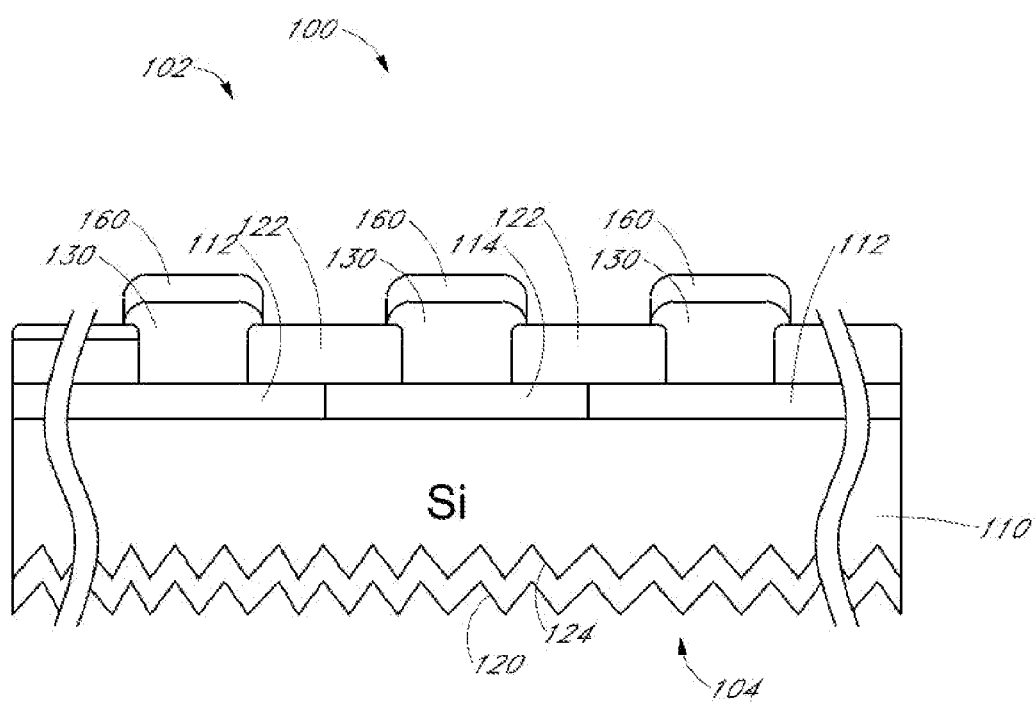

FIGS. 1-6 illustrate operations in a standard process for forming a contact region for a solar cell 100. Referring to FIG. 1 the standard process can include providing a solar cell 100 having a front side 104 configured to face the sun during normal operation and back side 102 opposite the front side 104. The solar cell can also include a substrate or a silicon substrate 110, first and second doped regions 112, 114 and contact regions 126 on both doped regions 112, 114, where the contact regions 126 can be formed using standard etching techniques. The provided solar cell 100 can also have an anti-reflective layer (ARC) 120 deposited on a textured region 124 on the front side 104. The provided solar cell 100 can also have a back anti-reflective layer (BARC) 122 deposited on the back side 102. In FIG. 2 the standard process can also include depositing a first metal layer 130 on the back side 102 of the solar cell 100 using physical vapor deposition (PVD) techniques, including sputtering and annealing. As shown in FIG. 3, the standard process includes curing 140 the first metal layer 130, where curing 140 the first metal layer 130 allows for the improved adhesion between the first metal layer 130 and the first and second doped regions 112, 114. The standard process can also include depositing an etch resist ink 142, 144 on the back side 102 of the solar cell in an interdigitated pattern and along the side edges of the solar cell 100 as shown in FIG. 4. In FIG. 5 the standard process can also include electrolytically plating a second metal layer 160 on the exposed regions of the first metal layer 130, where the etch resist ink 142, 144 prevents plating of excess metal along the back side and side edges of the solar cell 100. The standard process can also include removing the etch resist 142, 144 and the excess metals underneath the etch resist 142, 144, where the first metal layer 130 electrically couples the second metal layer 160 to the first and second doped regions 112, 114. FIG. 6 shows a cross-sectional view of a conventional solar cell fabricated with the standard process mentioned above.

In reducing the cost of producing the solar cell 100, it is advantageous to replace the first metal layer 130 formed by PVD with a first metal layer formed using a print deposition method. This printed first metal layer, however, may have a lower conductivity than the first metal layer 130 formed by PVD as discussed below.

Figure 7:
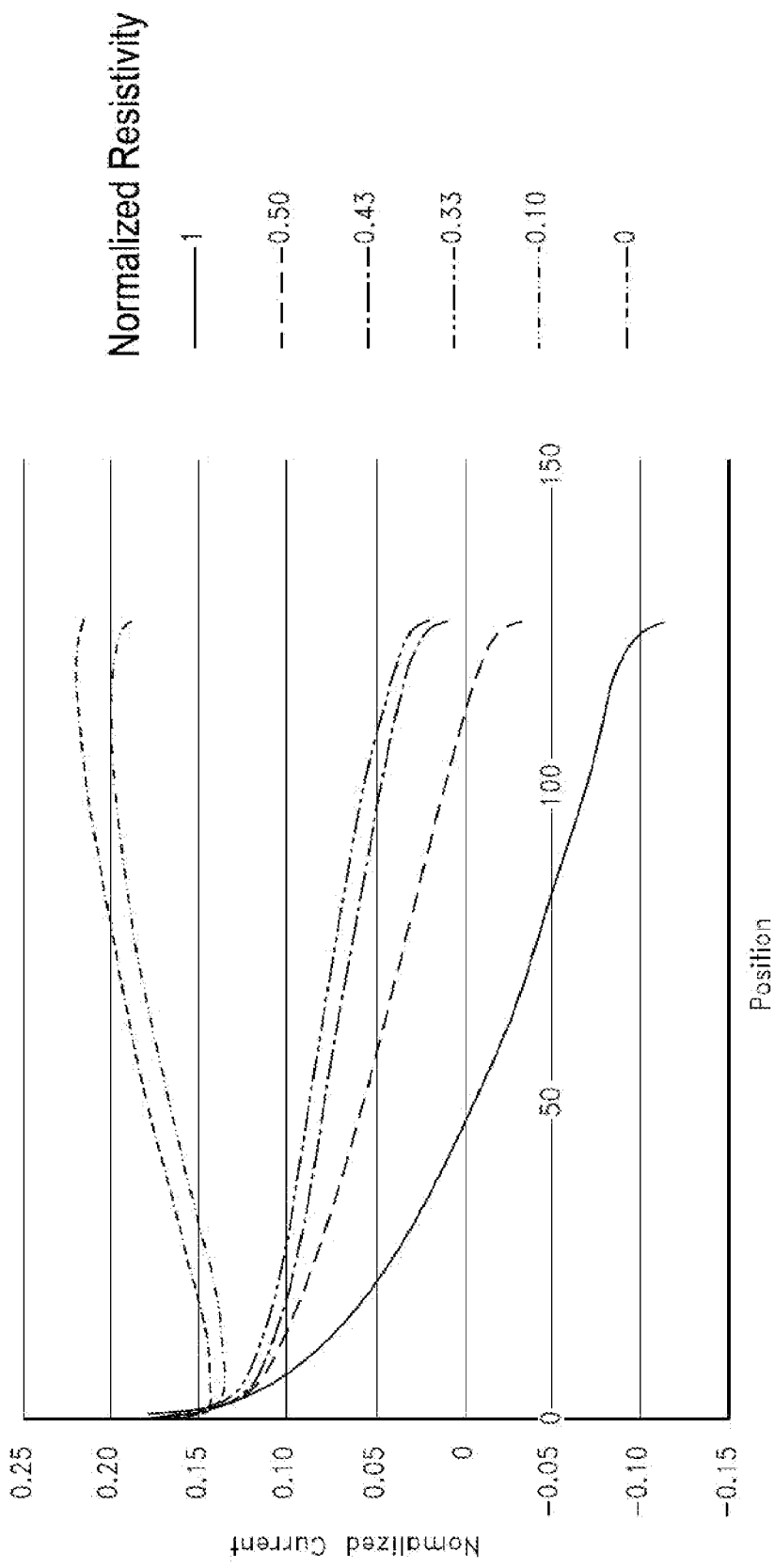
FIGS. 7-10 are graphical representations of a model for conductivity along a single and multiple metal contact fingers.
Figure 8:
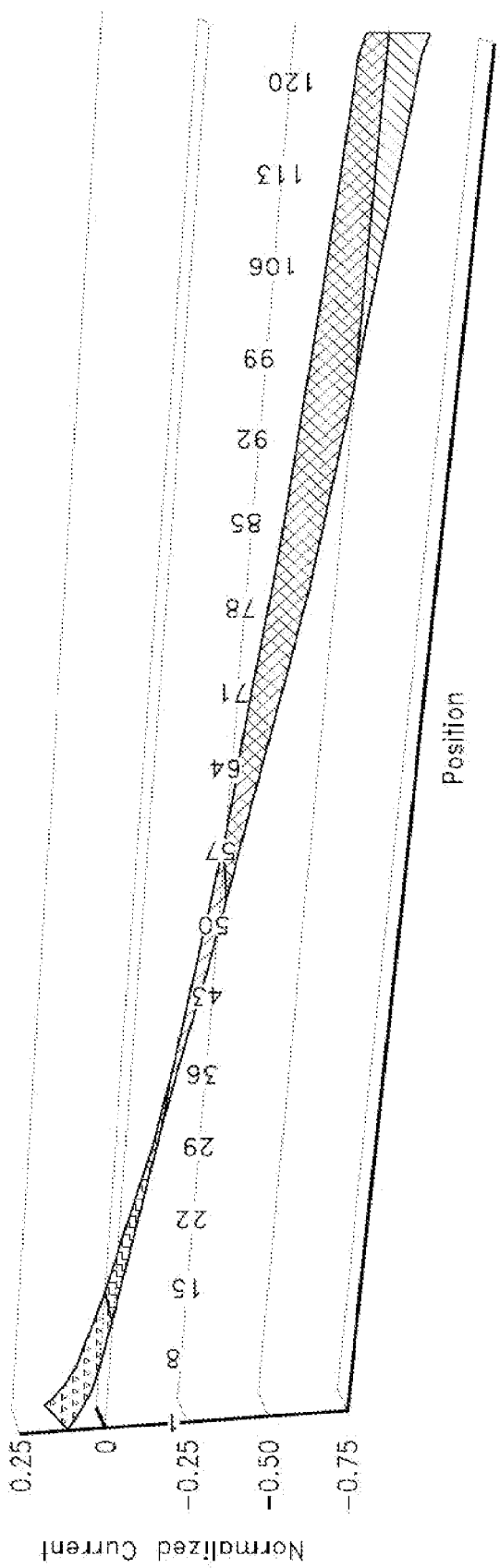
Figure 9:
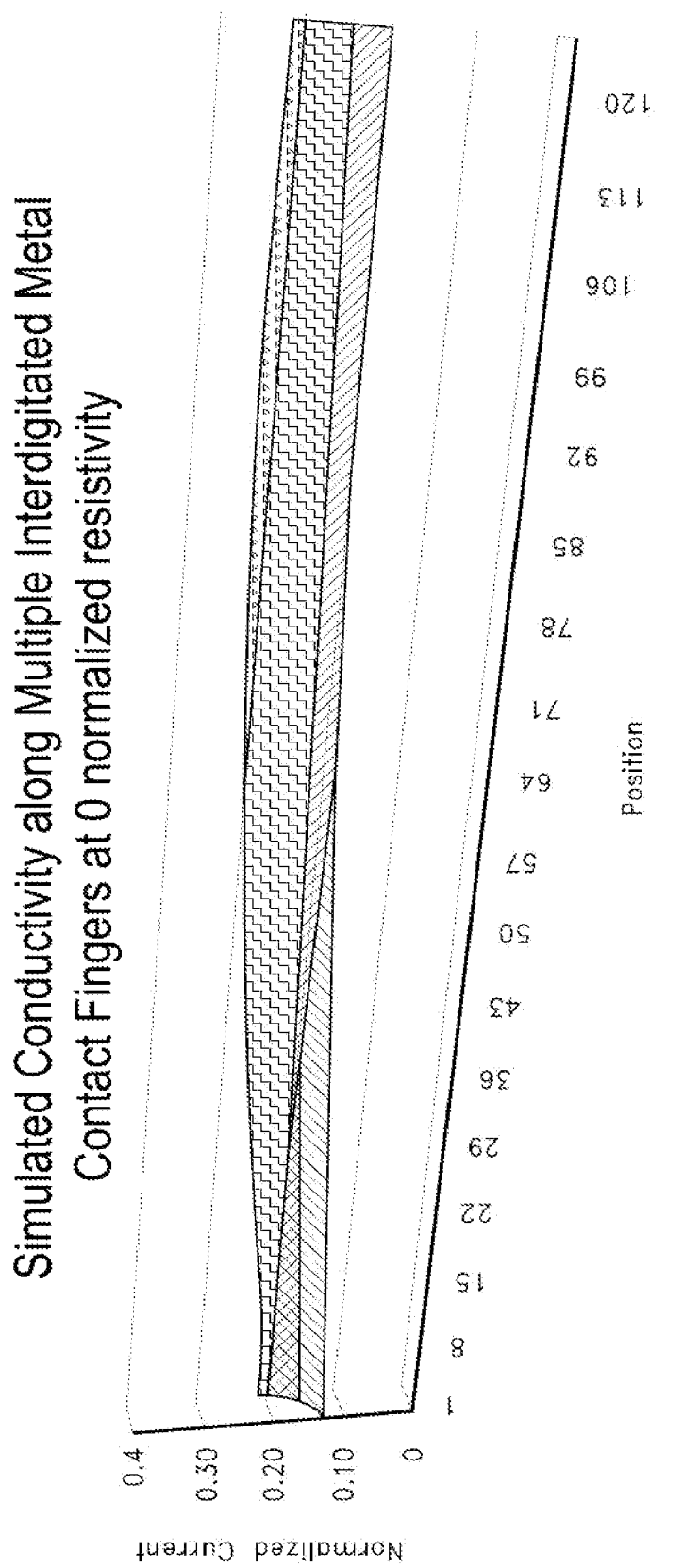
Figure 10:
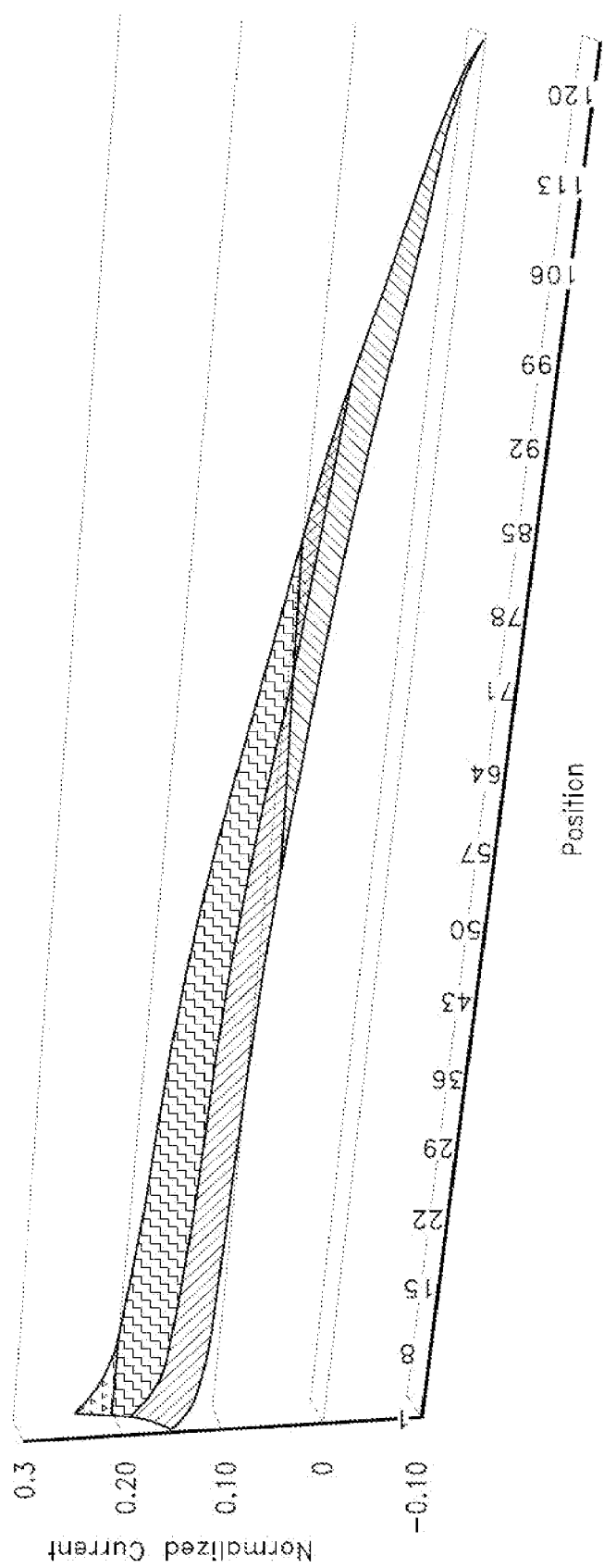

With reference to FIGS. 7-10, graphical representations of a model for conductivity loss along printed metal fingers are shown. The modeling process uses a printed aluminum paste on a solar cell at different resistivity values as a reference. Referring to FIG. 7, modeling the process confirms that electrical conductivity decreases along a single printed metal contact finger, from the 0 position at a bus bar where all the metal fingers extend to the ends of the fingers at around 100-150 cm. As can be observed from FIG. 7, no electrolytic plating can occur at the ends of the printed fingers where the end of the finger sits in a deplating condition, repelling any plating from occurring. FIGS. 8-10 illustrate the results for a more complex interdigitated metal finger case, where similar results are observed. Another alternative to printed aluminum paste is to replace aluminum with a higher conductivity metal. In this case silver or noble metal, such as gold, could be used but cost rapidly becomes prohibitive for these materials.

The above described standard processes are not cost effective and are inefficient for use in solar cell manufacturing processes. The proceeding descriptions, details of embodiments of the proposed methods are described that may provide an alternative solution to the standard processes mentioned above.

As a solution to the above, proposed methods instead involve the use of electroless plating techniques to increase the conductivity of the printed metal fingers. Since electroless plating does not rely on an external circuit to plate the metal, electroless plating rates do not depend on the conductivity of the printed metal finger or printed metal layer. In one such embodiment, electroless deposition is used to plate metal onto a printed metal layer, where the conductivity of the printed metal layer can be enhanced. The electroless technique can have the advantage of uniformly coating and filling in the voids between metal paste particles of the printed metal layer. This advantage of filling in the empty spaces between metal paste particles decreases the overall resistivity and increases conductivity of the printed metal layer. The method also allows for the reduction of process steps in the standard process mentioned above, such as the removal of the thermal steps, which can be combined in the deposition step and etch resist application and removal steps. Thus, one or more embodiments are directed to a method for forming a contact region for a solar cell including printing a metal layer on the back side of a solar cell, electrolessly plating a metal layer to the printed metal layer and subsequently electrolytically plating another metal layer to the electrolessly formed metal layer. Various approaches are described below.

Figure 11:
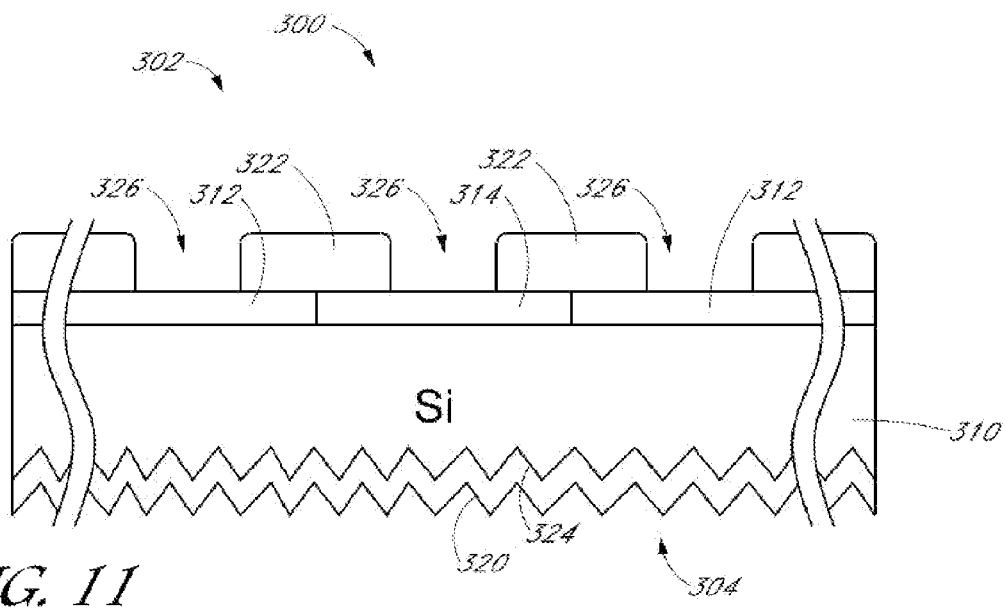
FIGS. 11-18 are cross-sectional representations of a solar cell being fabricated in accordance with a method for forming a contact region of a solar cell.

FIG. 11 illustrates a method for forming a contact region for a solar cell 300 is disclosed. The method includes providing a solar cell 300 having a front side 304 which faces the sun to receive light during normal operation and a back side 302 opposite the front side 304. In some embodiments, a substrate or silicon substrate 310 of the solar cell 300 is cleaned, polished, planarized, and/or thinned or otherwise processed prior to the formation of first and second doped regions 312, 314. In another embodiment the silicon substrate 310 is composed of polysilicon or multi-crystalline silicon. In still another embodiment, first and second doped regions 312, 314 are grown by a thermal process. In yet another embodiment, the first doped region 312 is deposited over the silicon substrate 310 by depositing dopants in the silicon substrate by a conventional doping process. In an embodiment, an oxide layer is deposited over the first doped region 312 and over the second doped region 314, serving as a protective barrier for both regions. The first and second doped regions 312, 314 each include a doping material but is not limited to a positive-type dopant such as boron or a negative-type dopant such as phosphorous. Although both the first and second doped regions 312, 314 are described as being grown by a thermal process or by depositing dopants in the silicon substrate by a conventional doping process, as with any other formation, deposition, or growth process operation described or recited here, each layer or substance can be formed using any appropriate process. For example, a chemical vapor deposition (CVD) process, low-pressure CVD (LPCVD), atmospheric pressure CVD (APCVD), plasma-enhanced CVD (PECVD), thermal growth, sputtering, as well as any other desired technique can be used where formation is described. In an embodiment, the first and second doped regions 312, 314 are formed on the silicon substrate 310 by a deposition technique, sputter, or print process, such as inkjet printing or screen printing. The method includes forming a texturized silicon region or a texturized surface 324 on the front side 304 of the solar cell 300 for increased solar radiation collection. A texturized surface 324 is one which has a regular or an irregular shaped surface for scattering incoming light, decreasing the amount of light reflected back off the surface of the solar cell. A first dielectric layer 320 is formed over the texturized surface 324 on the front side 304 to further improve the light absorption properties of the solar cell. In an embodiment, forming the first dielectric layer 320 includes forming an anti-reflective coating (ARC). A second dielectric layer 322 is formed on the back side 302 of the solar cell 300. In an embodiment, forming the second dielectric layer 322 on the back side 302 includes forming an anti-reflective coating (BARC). In another embodiment, both the ARC 320 and BARC 322 layers, either alone or together, are composed of silicon nitride (SiN) or any other material that is commonly used in forming an anti-reflective coating of a solar cell. The method includes forming a plurality of contact holes 326 on the first and second doped regions 312, 314 and through a first dielectric layer 322. In an embodiment, the contact holes 326 are formed by any number of lithography processes including wet etching and ablation techniques. In an embodiment, the solar 300 cell includes a solar cell such as, but not limited to, a back-contact solar cell, a front-contact solar cell, a monocrystalline silicon solar cell, a polycrystalline silicon solar cell, an amorphous silicon solar cell, a thin film silicon solar cell, a copper indium gallium selenide (CIGS) solar cell, or a cadmium telluride solar cell.

Figure 12:
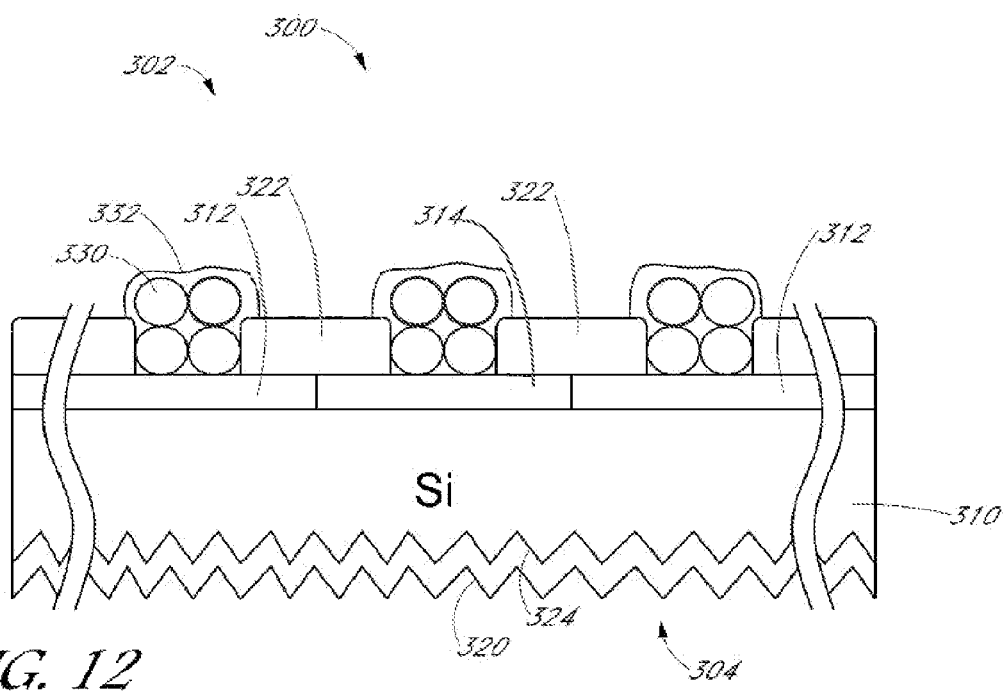
Figure 13:
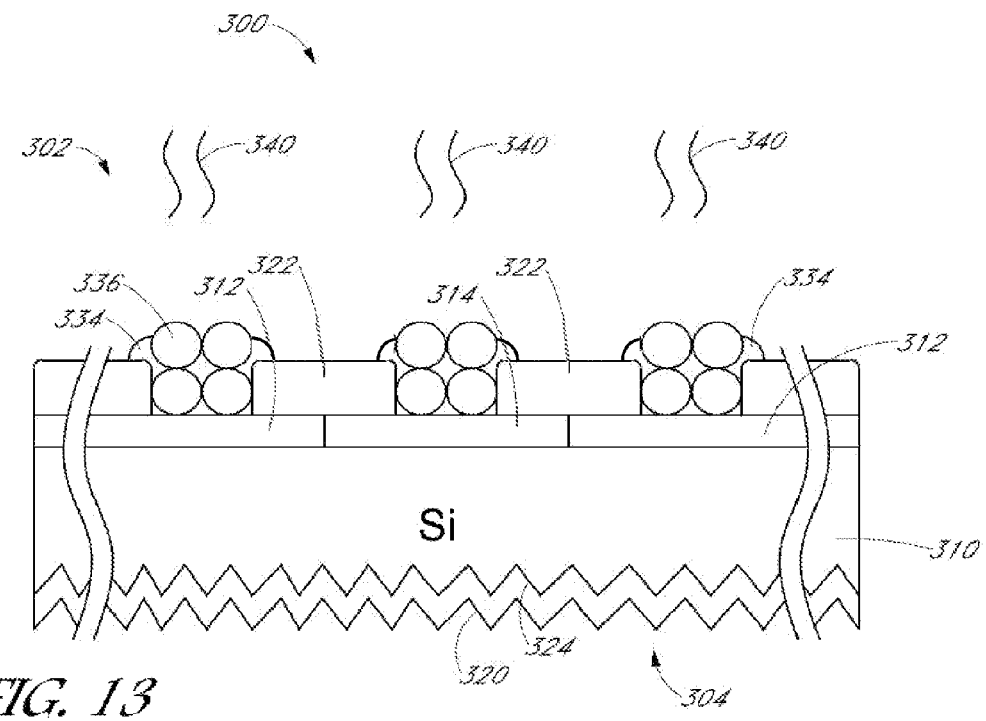

With reference to FIGS. 12 and 13, a continuation of the method for forming a contact region for a solar cell 300 is shown. The method includes depositing a continuous paste above a substrate 310 of the solar cell 300. In an embodiment, the substrate 310 is a silicon substrate and the paste includes a first metal 330 and a cohesive matrix 332. In another embodiment, printing techniques, including screen printing, spin coating and inkjet printing are used to deposit the paste on the substrate 310. In still another embodiment, the first metal 330 includes metal particles. In yet another embodiment, the paste is an aluminum paste including aluminum particles. As shown in FIG. 13, the method includes curing 340 the paste to form a first metal layer 336 from the first metal 330. During the curing process 340, the cohesive matrix can form a second state 334 and evaporate subsequent to further curing 340. In an embodiment, depositing the paste above the substrate includes depositing paste on a polysilicon region disposed on the substrate 310. In another embodiment, the paste can instead be an aluminum paste. In still another embodiment, the deposited aluminum paste has a thickness of at least 0.5 microns. In yet another embodiment, curing 340 the aluminum paste forms a layer of aluminum. In an embodiment, the curing process is performed with the deposition process. In still another embodiment, the curing process is performed as a standalone process. In yet another embodiment, the curing process is a curing process selected from the group consisting of thermal cure, ultraviolet (UV) cure, infrared cure and any other radiative cure.

Figure 14:
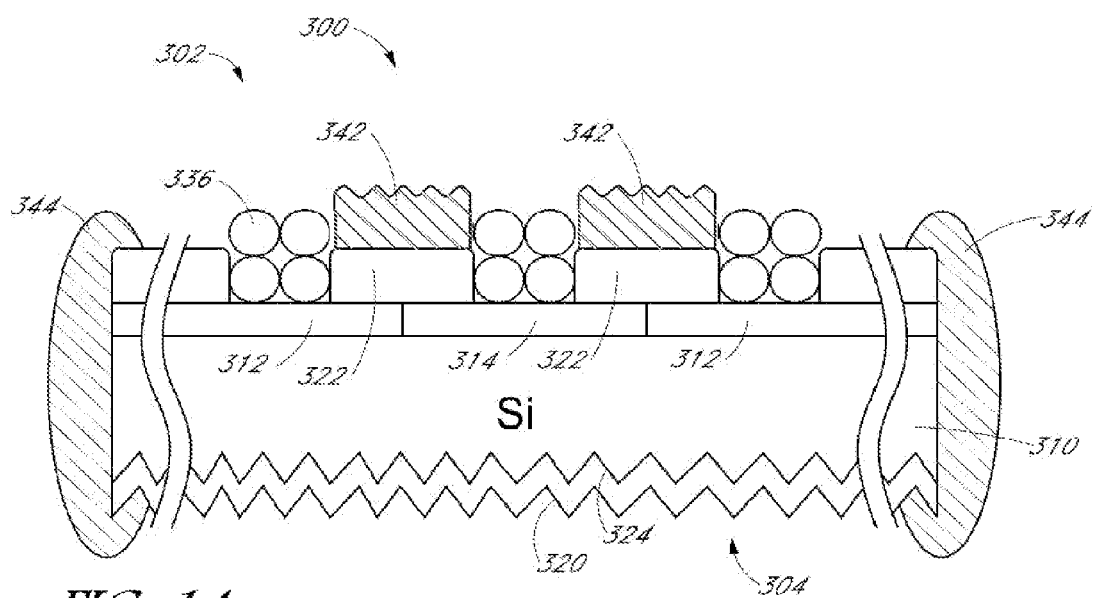
Figure 15:
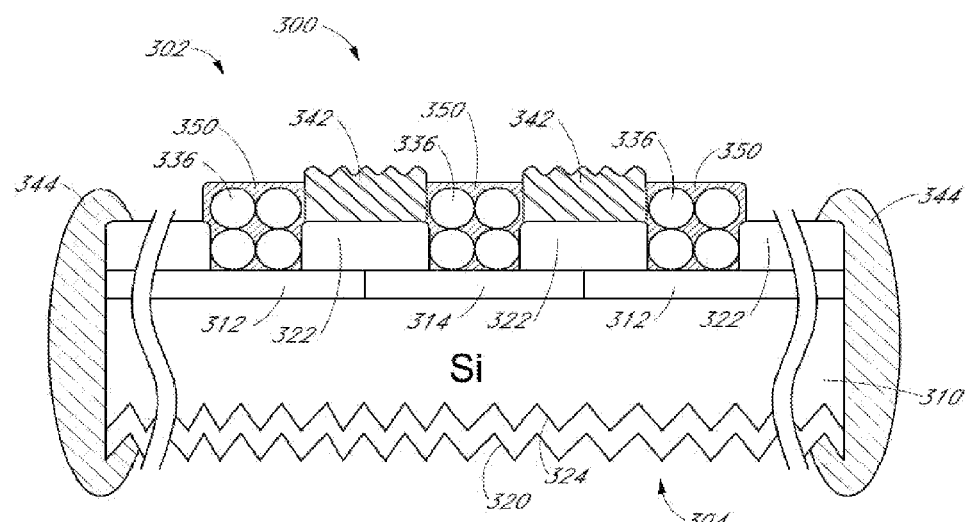
Figure 16:
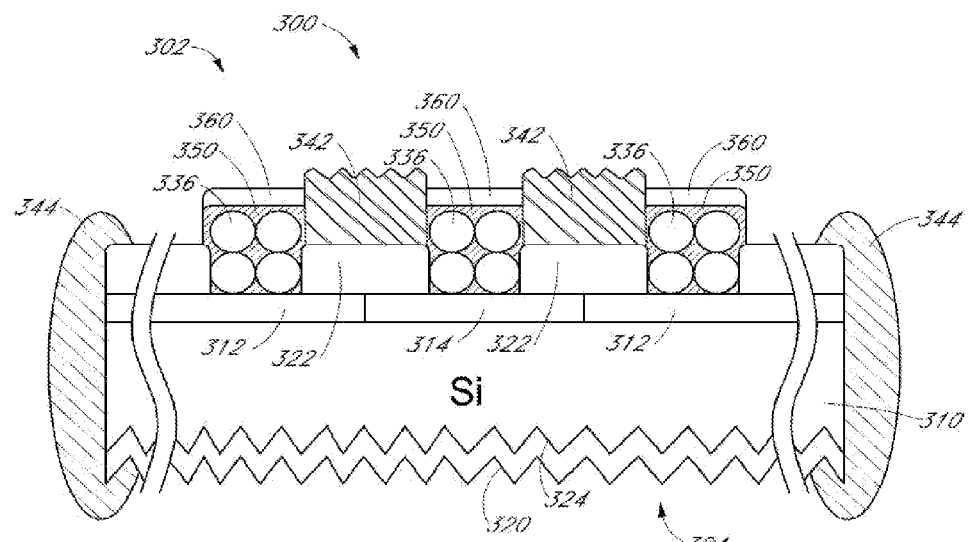
Figure 17:
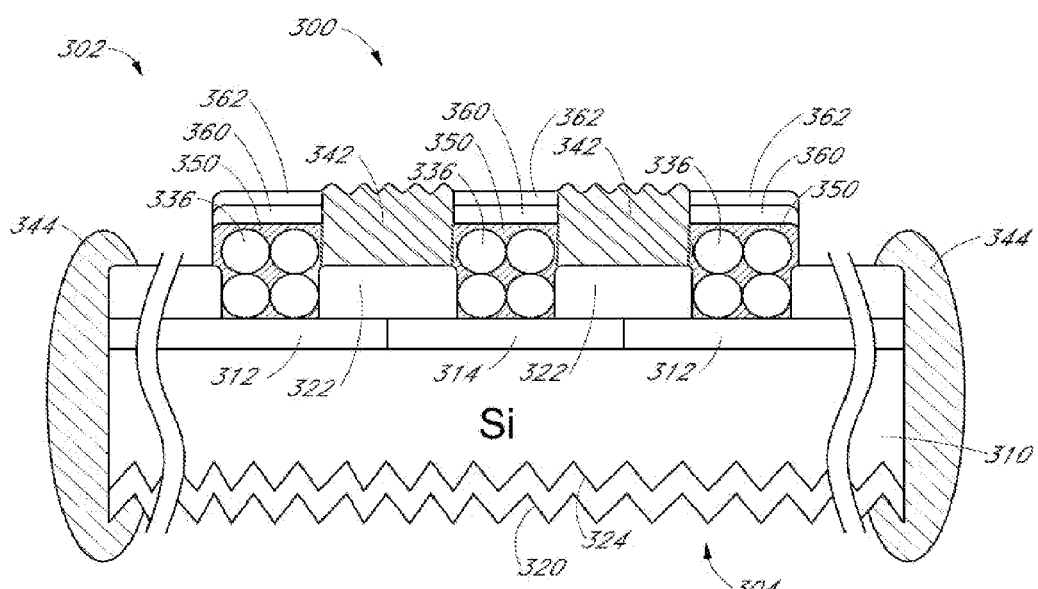

FIGS. 14-17 illustrate a continuation of the method for forming a contact region for a solar cell 300. The method includes depositing an etch resist ink 342, 344 on the back side 302 of the solar cell in an interdigitated pattern and along the side edges of the solar cell 300 as shown in FIG. 14. FIG. 15 shows the method which includes electrolessly plating a second metal layer 350 on the exposed regions of the first metal layer 336. Subsequently, FIG. 16 shows the method includes electrolytically plating a third metal layer 360 on the exposed regions of the second metal layer 350. In an embodiment, the method includes electrolytically plating a fourth metal 362 layer on the exposed regions of the third metal layer 360 as shown in FIG. 17. The etch resist ink 342, 344 prevents plating excess metal along the back side 302 and side edges of the solar cell 300. In an embodiment, the second metal layer 350 includes a barrier metal adapted to prevent diffusion of metals from the third metal layer 360 into the silicon substrate 310. In another embodiment, electrolessly plating the second metal layer 350 includes electrolessly plating a metal such as, but not limited to, nickel, gold, silver, rhodium, chromium, zinc, tin or cadmium. In still another embodiment, electrolessly plating the second metal layer 350 includes electrolessly plating a metal layer having a thickness of at least 0.1 microns. In yet another embodiment, electrolytically plating the third and fourth metal layer 360, 362 includes electrolytically plating a metal such as, but not limited to, copper, tin, aluminum, silver, gold, chromium, iron, nickel, zinc, ruthenium, palladium, or platinum.

Figure 18:
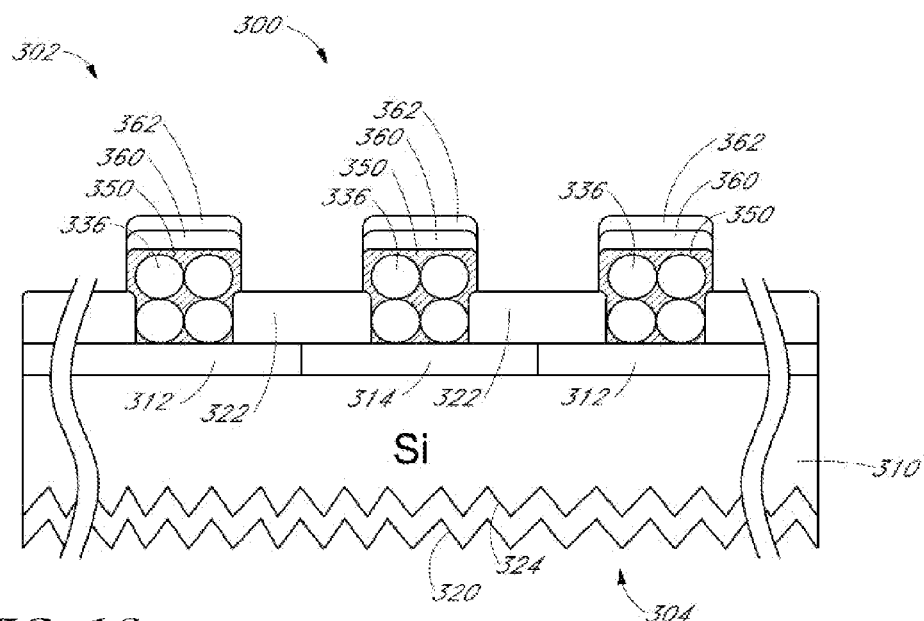

With reference to FIG. 18, there are shown a continuation of the method for forming a contact region for a solar cell 300. The method includes removing the etch resist 342, 344 and the excess metals underneath the etch resist 342, 344 forming a solar cell 300 having interdigitated contact fingers where the second metal layer 350 electrically couples the first metal layer 336 to the third and fourth metal layers 360, 362 and the first metal layer 336 electrically couples the metal layers 350, 360, 362 to the first and second doped regions 312, 314.

Figure 19:
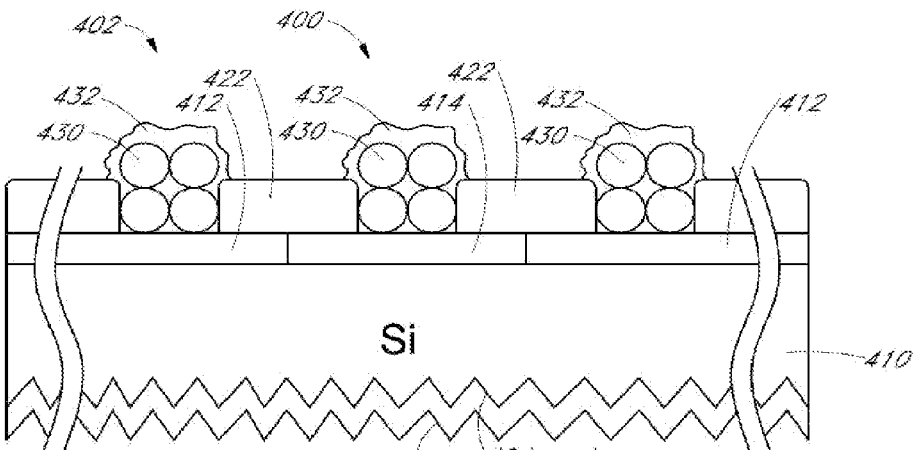
FIGS. 19-23 are cross-sectional representations of a solar cell being fabricated in accordance with another method for forming a contact region of a solar cell.
Figure 20:
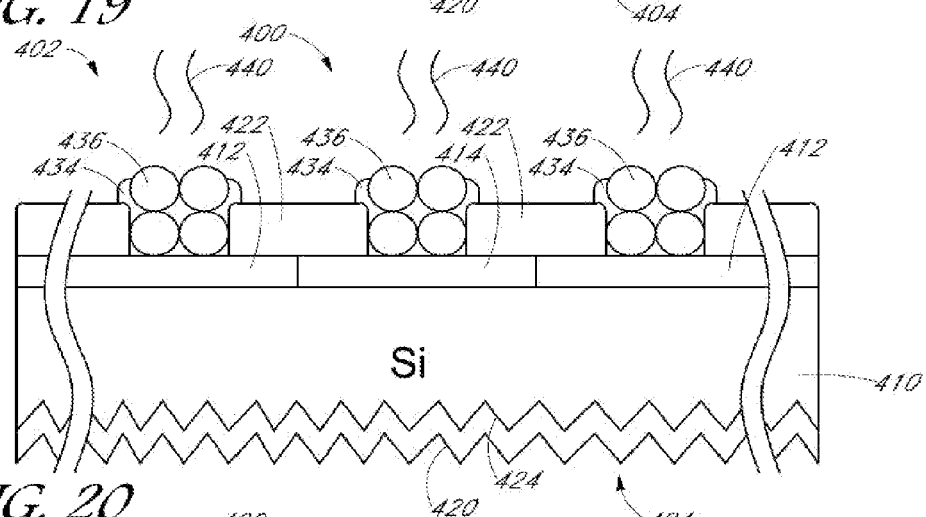

FIGS. 19 and 20 illustrate another method for forming a contact region for a solar cell 400 similar to the solar cell 300 as mentioned in the description above. The method includes providing a solar cell 400 having a front side 404 which faces the sun to receive light during normal operation and a back side 402 opposite the front side 404. In some embodiments, a substrate or silicon substrate 410 of the solar cell 400 is cleaned, polished, planarized, and/or thinned or otherwise processed similar to that described above. In another embodiment the silicon substrate 410 is composed of polysilicon or multi-crystalline silicon. In still another embodiment, the first and second doped regions 412, 414 are grown by a thermal process. In yet another embodiment, the first doped region 412 is deposited on the silicon substrate 410 by depositing dopants in the silicon substrate by a conventional doping process. In an embodiment, an oxide layer is deposited on the first doped region 412 and on the second doped region 414, serving as a protective barrier for both regions. In another embodiment, the first and second doped regions 412, 414 each include a doping material but is not limited to a positive-type dopant such as boron or a negative-type dopant such as phosphorous. Although both the first and second doped regions 412, 414 are described as being grown by a thermal process or by depositing dopants in the silicon substrate by a conventional doping process, as with any other formation, deposition, or growth process operation described or recited here, each layer or substance can be formed using any appropriate process. A first dielectric layer 420 is formed over the texturized surface 424 on the front side 404 to further improve the light absorption properties of the solar cell. In an embodiment, forming the first dielectric layer 420 includes forming an anti-reflective coating (ARC). A second dielectric layer 422 is formed on the back side 402 of the solar cell 400. In an embodiment, forming the second dielectric layer 422 on the back side 402 includes forming an anti-reflective coating (BARC). In another embodiment, both the ARC 420 and BARC 422 layers, either alone or together, are composed of silicon nitride (SiN) or any other material that is commonly used in forming an anti-reflective coating of a solar cell. The method includes depositing a continuous paste having a first metal 430 and a cohesive matrix 432 in an interdigitated pattern above contact regions through a first dielectric layer 422 on both a first and second doped regions 412, 414. As shown in FIG. 20, the method includes curing 440 the first metal 430 and cohesive matrix 432 to form a first metal layer 436 and a cohesive matrix in a second state 434, where the cohesive matrix in a second state evaporates subsequent to the curing process 440. In an embodiment, depositing the paste above the substrate includes depositing paste on a polysilicon region above the substrate. In another embodiment, the paste instead is an aluminum paste. In still another embodiment, the deposited aluminum paste has a thickness of at least 0.5 microns. In yet another embodiment, curing 440 the aluminum paste forms a layer of aluminum. In an embodiment, the curing process is performed with the deposition process. In another embodiment, the curing process is performed as a standalone process. In still another embodiment, the curing process is a curing process selected from the group consisting of thermal cure, ultraviolet (UV) cure, infrared cure and any other radiative cure. In yet another embodiment, the solar cell 400 includes a solar cell such as, but not limited to, a back-contact solar cell, a front-contact solar, a monocrystalline silicon solar cell, a polycrystalline silicon solar cell, an amorphous silicon solar cell, a thin film silicon solar cell, a copper indium gallium selenide (CIGS) solar cell, or a cadmium telluride solar cell.

Figure 21:
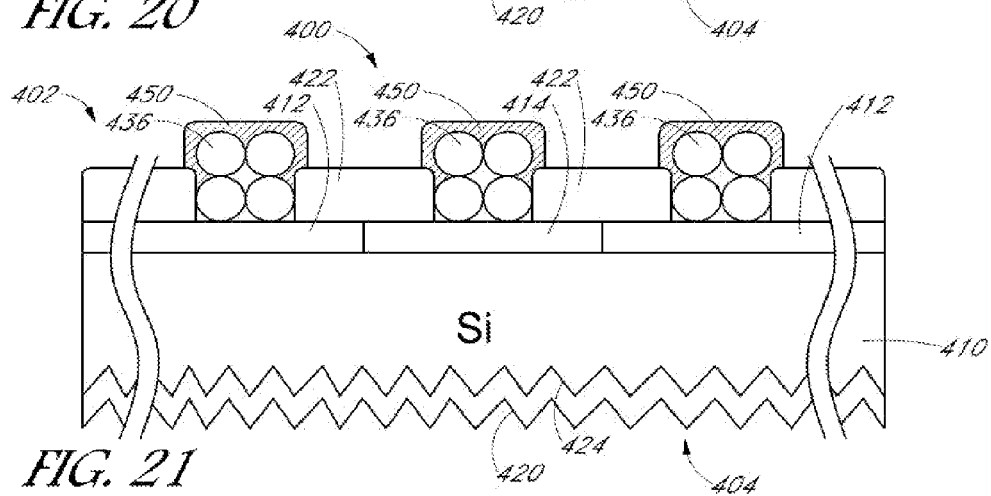
Figure 22:
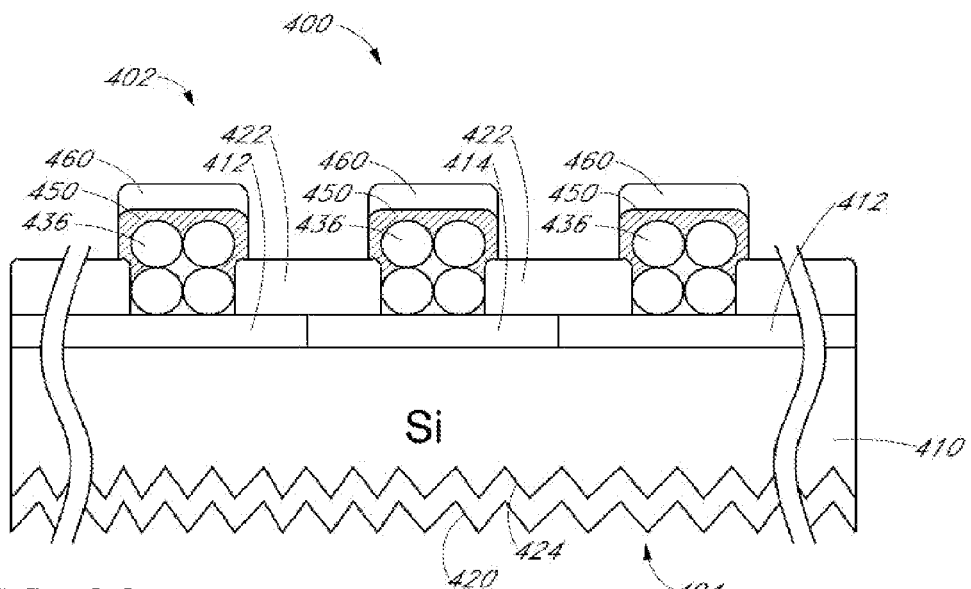
Figure 23:
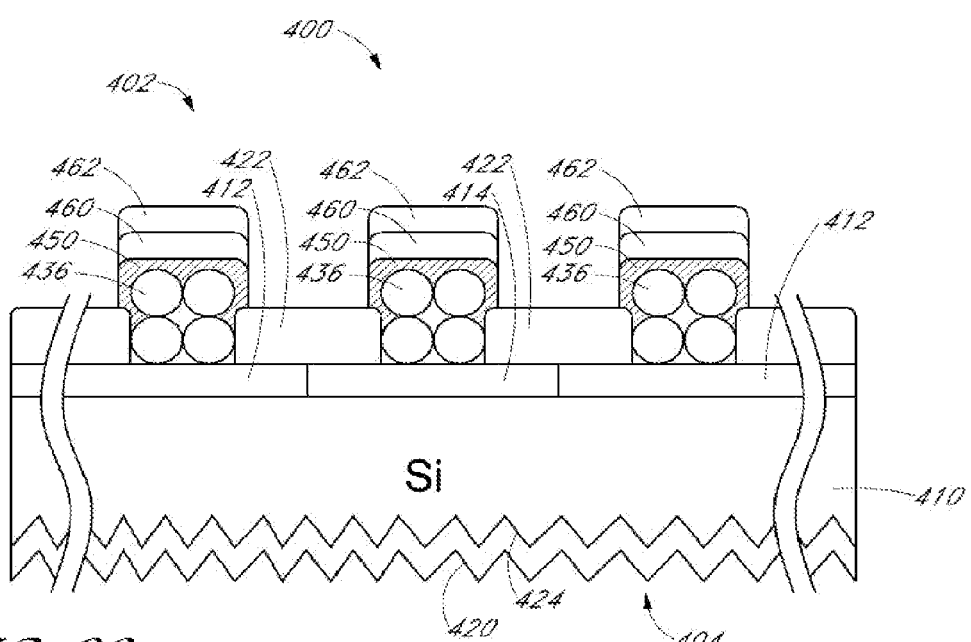

With reference to FIGS. 21-23, a continuation of the method for forming a contact region for a solar cell 400 is shown. The method includes electrolessly forming a second metal layer 450 on the exposed region of the first metal layer 436. Subsequent to electrolessly forming a second metal layer 450, FIG. 21 shows the method includes forming a third metal layer 460 on the exposed regions of the second metal layer 450 through an electrolytic plating process. In an embodiment, the method includes electrolytically plating a fourth metal layer 462 on the third metal layer 460 as shown in FIG. 22. In an embodiment, the second metal layer 450 includes a barrier metal adapted to prevent diffusion of metals from the third metal layer into the substrate. In another embodiment, electrolessly plating the second metal layer 450 includes electrolessly plating a metal such as, but not limited to, nickel, gold, silver, rhodium, chromium, zinc, tin or cadmium. In still another embodiment, electrolessly plating the second metal layer 450 includes electrolessly plating a metal layer having a thickness of at least 0.1 microns. In yet another embodiment, electrolytically plating the third and fourth metal layer 460, 462 includes electrolytically plating a metal such as, but not limited to, copper, tin, aluminum, silver, gold, chromium, iron, nickel, zinc, ruthenium, palladium, or platinum. Similar to FIG. 18, FIG. 23 shows a solar cell 400 having interdigitated contact fingers where the second metal layer 450 electrically couples the first metal layer 436 to the third and fourth metal layers 460, 462 and the first metal layer 436 electrically couples the metal layers 450, 460, 462 to the first and second doped regions 412, 414.

Figure 24:
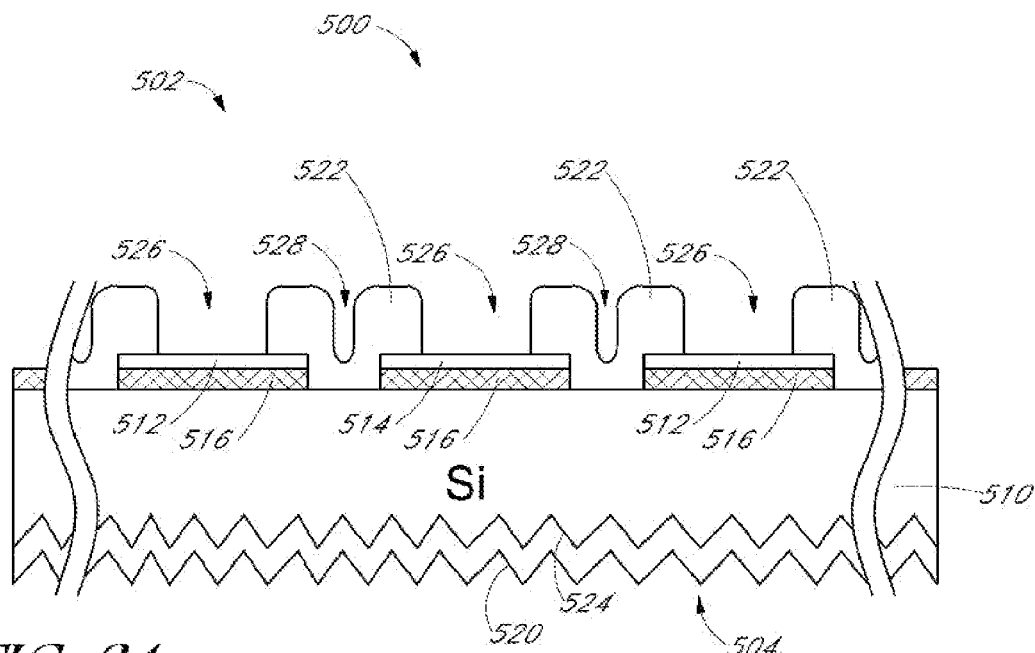
FIGS. 24 and 25 are cross-sectional representations of a solar cell being fabricated in accordance with still another method for forming a contact region of a solar cell.

FIG. 24 illustrates still another method for forming a contact region for a solar cell 500. The method includes providing a solar cell 500 having a front side 504 that faces the sun during normal operation and a back side 502 opposite the front side 504. Similar to that mentioned above, the substrate or silicon substrate 510 of the solar cell 500 is cleaned, polished, planarized, and/or thinned or otherwise processed prior to the formation of a first and second doped polysilicon regions 512, 514. In another embodiment, first and second doped polysilicon regions 512, 514 are grown by a thermal process. In yet another embodiment, first and second doped polysilicon regions 512, 514 are deposited over the silicon substrate 510 by depositing dopants in the silicon substrate by a conventional doping process. In still another embodiment, a third dielectric layer 516 is deposited on the silicon substrate 510 prior to forming the first and second doped polysilicon regions 512, 514. In yet another embodiment, the third dielectric layer 516 is a tunnel oxide layer. The first and second doped polysilicon regions 512, 514 each include a doping material but is not limited to a positive-type dopant such as boron or a negative-type dopant such as phosphorous. Although both the first and second doped polysilicon regions 512, 514 are described as being grown by a thermal process or by depositing dopants in the silicon substrate by a conventional doping process as with any other formation, deposition, or growth process operation described or recited here, each layer or substance is formed using any appropriate process as described above. In an embodiment, an amorphous silicon layer is formed on the back side 502 of the solar cell 500 subsequent to forming the first and second doped polysilicon regions 512, 514. In another embodiment, a plurality of trench regions 528 are formed, where the trench regions 528 separate the first and second doped polysilicon regions 512, 514. The solar cell 500 is provided with a texturized silicon region or a texturized surface 524 on the front side 504 of the solar cell for increased solar radiation collection. A texturized surface 524 is similar to the texturized surface 324 mentioned above. In an embodiment, the trench regions 528 have a texturized silicon region and can be formed during the same process of forming the texturized surface 524 on the front side 504 of the solar cell 500. A first dielectric layer 520 is formed over the texturized surface 524 on the front side 504 to further improve the light absorption properties of the solar cell. In an embodiment, forming the first dielectric layer 520 includes forming an anti-reflective coating (ARC). A second dielectric layer 522 is formed on the back side 502 of the solar cell 500. In an embodiment, forming the second dielectric layer 522 on the back side 502 includes forming an anti-reflective coating (BARC). In another embodiment, both the ARC 520 and BARC 522 layers, either alone or together, are composed of silicon nitride (SiN) or any other material that is commonly used in forming an anti-reflective coating of a solar cell. A plurality of contact holes 526 are formed through a first dielectric layer 522 and on the first and second doped polysilicon regions 512, 514. The contact holes 526 are formed by any number of lithography processes including wet etching and ablation techniques. In an embodiment, the solar 500 cell includes a solar cell such as, but not limited to, a back-contact solar cell, a front-contact solar cell, a monocrystalline silicon solar cell, a polycrystalline silicon solar cell, an amorphous silicon solar cell, a thin film silicon solar cell, a copper indium gallium selenide (CIGS) solar cell, or a cadmium telluride solar cell.

Figure 25:
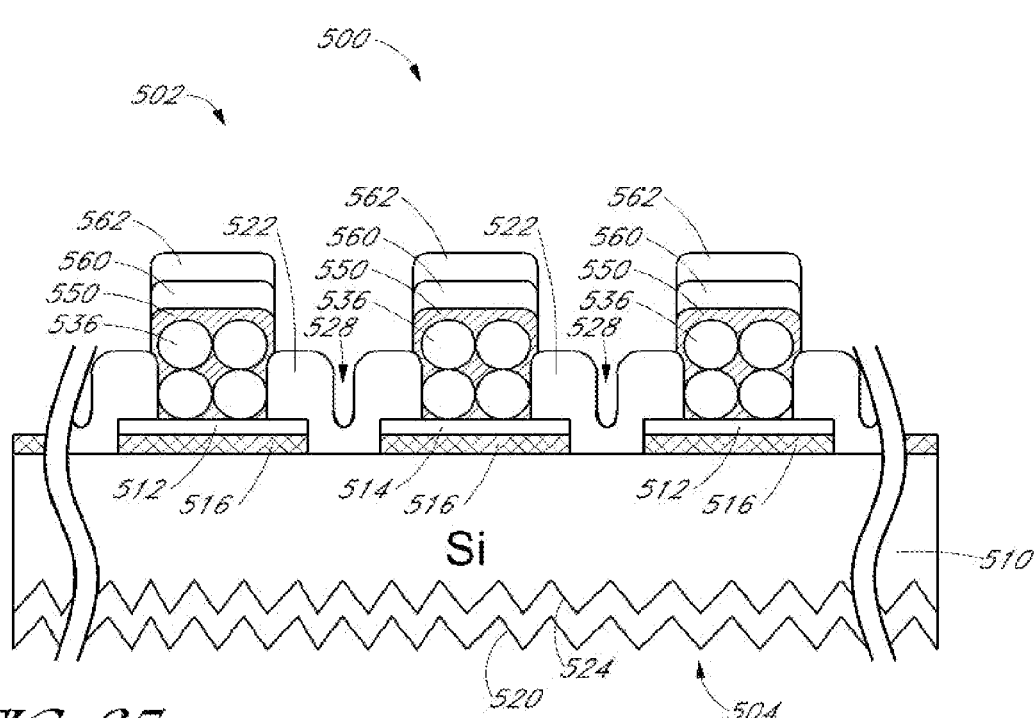

With reference to FIG. 25, a continuation of the method for forming a contact region for a solar cell 500 is shown. Similar to approaches described above, a method for fabricating a solar cell can be performed including forming a first metal layer 536 on the back side 502 of a solar cell 500. The method includes depositing a paste having a first metal and a cohesive matrix in an interdigitated pattern above contact regions through a first dielectric layer 522, on both a first and second doped polysilicon regions 512, 514. The method includes curing 540 the first metal and cohesive matrix to form a first metal layer 536. In another embodiment, the paste can instead be an aluminum paste. In still another embodiment, the deposited aluminum paste can have a thickness of at least 0.5 microns. In yet another embodiment, curing the aluminum paste forms a layer of aluminum. The method includes electrolessly plating a second metal layer 550 to the first metal layer 536 and subsequently electrolytically plating a third metal layer 560 to the second metal layer 550 and, where the second metal layer 550 electrically couples the first metal layer 536 to the third metal layer 560 and the first metal layer 536 electrically couples the subsequent metal layers 550, 560 to the first and second doped regions 512, 514. In an embodiment, the method further includes electrolytically plating a fourth metal layer 562 to the third metal layer 560. In another embodiment, the second metal layer 550 includes a barrier metal adapted to prevent diffusion of metals from the third metal layer into the substrate. In still another embodiment, electrolessly plating the second metal layer 550 includes electrolessly plating a metal such as, but not limited to, nickel, gold, silver, rhodium, chromium, zinc, tin or cadmium. In yet another embodiment, electrolessly plating the second metal layer 550 includes electrolessly plating a metal layer having a thickness of at least 0.1 microns. In yet another embodiment, electrolytically plating the third and fourth metal layer 560, 562 includes electrolytically plating a metal such as, but not limited to, copper, tin, aluminum, silver, gold, chromium, iron, nickel, zinc, ruthenium, palladium, or platinum. Similar to FIGS. 18 and 23, FIG. 25 shows a solar cell 500 having interdigitated contact fingers where the second metal layer 550 electrically couples the first metal layer 536 to the third and fourth metal layers 560, 562 and the first metal layer 536 electrically couples the metal layers 550, 560, 562 to the first and second doped polysilicon regions 512, 514.

Figure 26:
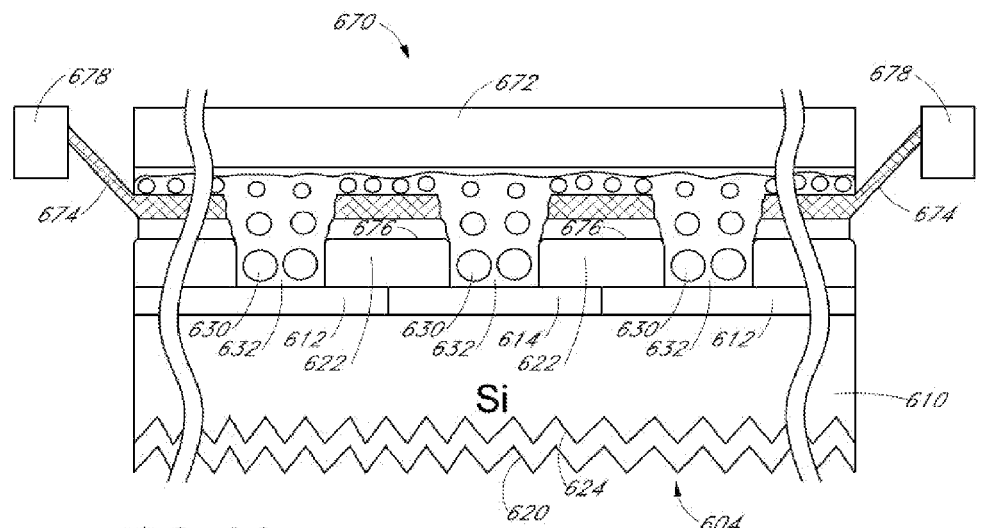
FIGS. 26 and 27 are cross-sectional representations of a solar cell being fabricated in accordance with method for forming a contact region of a solar cell.

FIG. 26 illustrates a method for forming a contact region for a solar cell 600. The method includes providing a solar cell 600 similar to the embodiments 300, 400, 500 described above. The method also includes screen printing a paste having a first metal 630 and a cohesive matrix 632. The screen printer 670 can include a squeegee 672, a screen 674, a frame 678 and emulsion 676 on the screen 674. The screen print method includes using the squeegee 672 to spread the paste through the screen 674 and onto the back side 602 of the solar cell 600. The emulsion 676 on the screen 674 prevents paste from escaping in a defined pattern. In an embodiment, the method includes printing a pattern of paste in an interdigitated pattern using an interdigitated pattern of emulsion 676 on the screen 674. In another embodiment, the method includes printing a continuous paste through the screen 674 without any emulsion 676.

Figure 27:
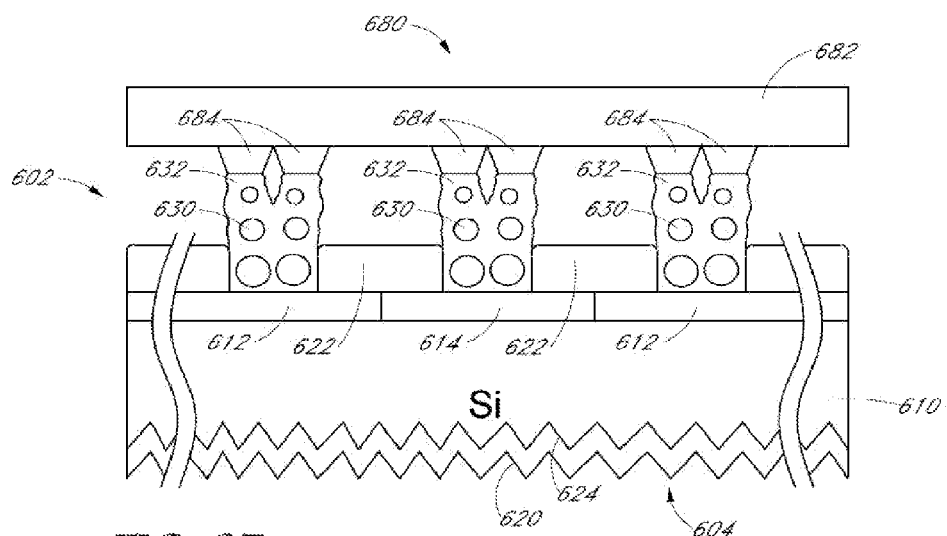

With reference to FIG. 27, a method for forming a contact region for a solar cell 600 is shown. The method includes providing a solar cell 600 similar to the embodiments 300, 400, 500 described above. The method also includes printing a paste having a first metal 630 and a cohesive matrix 632 using an inkjet printer 680. The inkjet printer 680 includes a print head 682 and a plurality of print nozzles 684, where the inkjet printer 680 is coupled to a computer. In an embodiment, the method includes using the print head 682 and the plurality of print nozzles 684 to deposit the paste onto the back side 602 of the solar cell 600 in a pattern generated from the computer, where the pattern can be an interdigitated pattern or a continuous pattern similar to that mentioned above.

Figure 28:
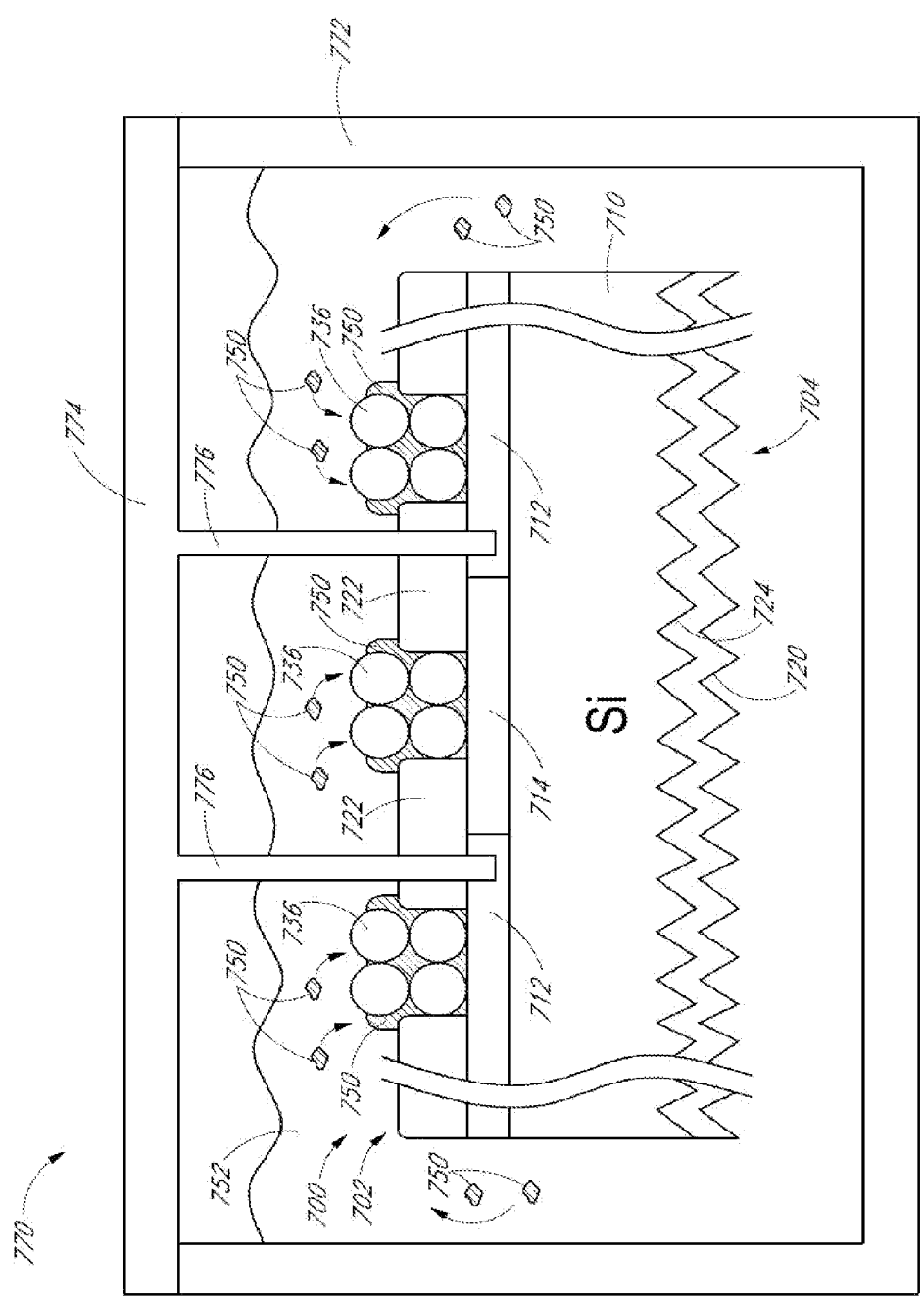
FIGS. 28 and 29 are cross-sectional representations of a solar cell being fabricated in accordance with another method for forming a contact region of a solar cell.

FIG. 28 illustrates a method for electrolessly plating metal to a printed metal layer on solar cell 700. The method includes providing an electroless plating setup 770 including a solar cell 700 having a first metal layer 736 immersed in an electroless plating medium 752 within a plating tank 772. The method also includes suspending the solar cell 700 by a holder 774 and a plurality of fixtures 776. The method includes inducing an auto-catalytic reaction within the electroless plating medium 752 to deposit a metal selected from the group consisting of nickel, gold, silver, rhodium, chromium, zinc, tin and cadmium. In an embodiment, the solar cell 700 can be similar the solar cells mentioned in the embodiments 300, 400, 500, 600 above. The method further includes performing an electroless plating process to form a second metal layer 750 on the exposed region of the printed metal layer or first metal layer 736 on the back side 702 of the solar cell 700. In an embodiment, the method can include electroless nickel plating to form a second metal layer 750, such as nickel, onto the first metal layer 736.

Figure 29:
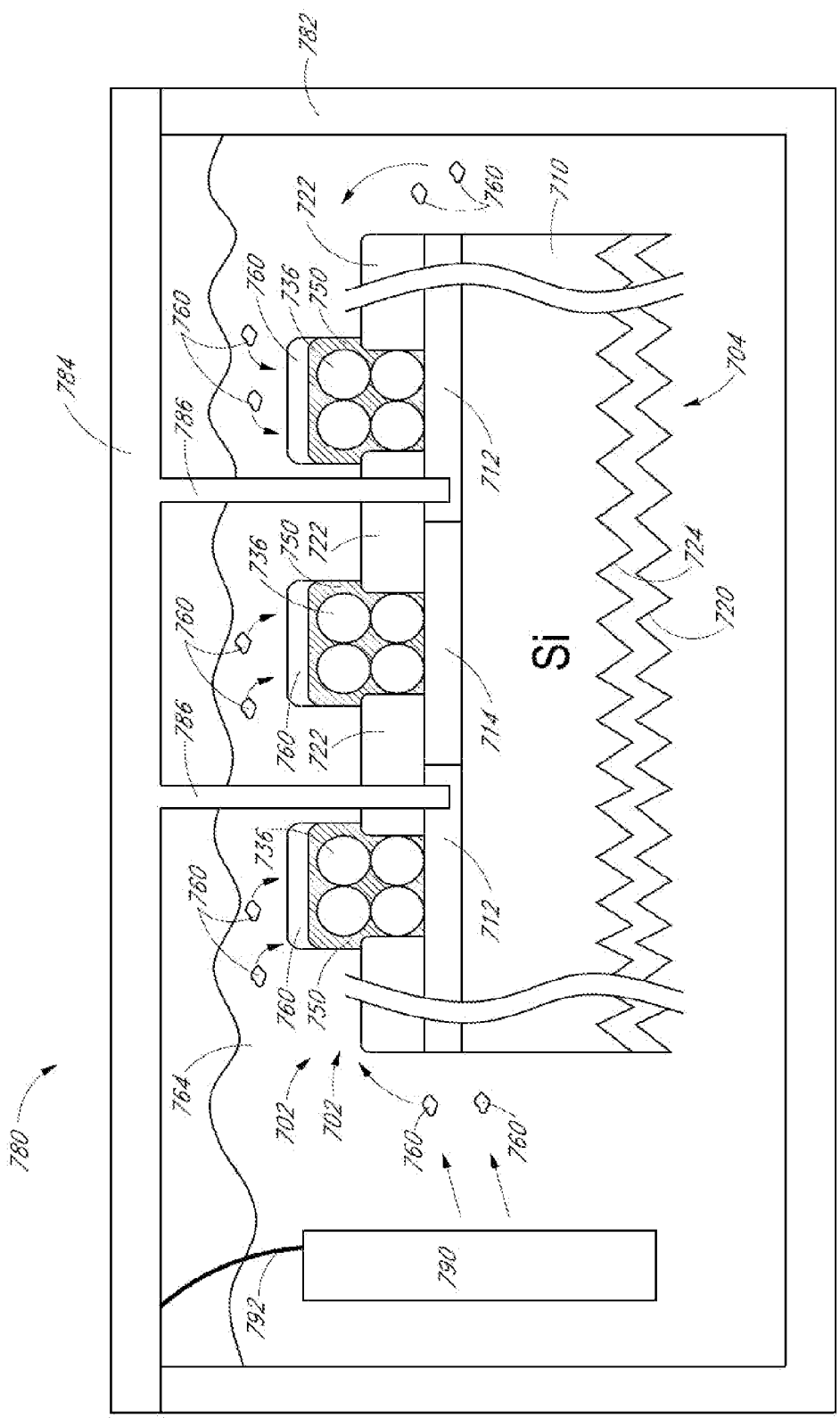

With reference to FIG. 29, a method for electrolytically plating metal to an electrolessly plated metal region on solar cell 700 is shown. The method includes providing an electrolytic plating setup 780 including a solar cell 700 having an electrolessly formed metal layer or a second metal layer 750 immersed in an electrolytic plating medium 764 within a plating tank 782. The method also includes suspending the solar cell 700 by a holder 784 and a plurality of fixtures 786 similar to the above. The method includes providing an anode 790 connected to an external power supply by a wire or an interconnect 792. The method also includes inducing a current, provided by the anode 790 coupled with the external power supply, within the electrolytic plating medium 764, which may allow for the flow of electrons within the medium and further allow for electrolytic plating of a metal such as, but not limited to, copper, tin, aluminum, silver, gold, chromium, iron, nickel, zinc, ruthenium, palladium, or platinum. The method includes performing an electrolytic plating process to form a third metal layer 760 on the second metal layer 750 of the solar cell 700. In an embodiment, the method can further include electrolytically plating a fourth metal layer to the third metal layer 760 using the same electrolytic plating setup 780 and methods mentioned above.

Figure 30:
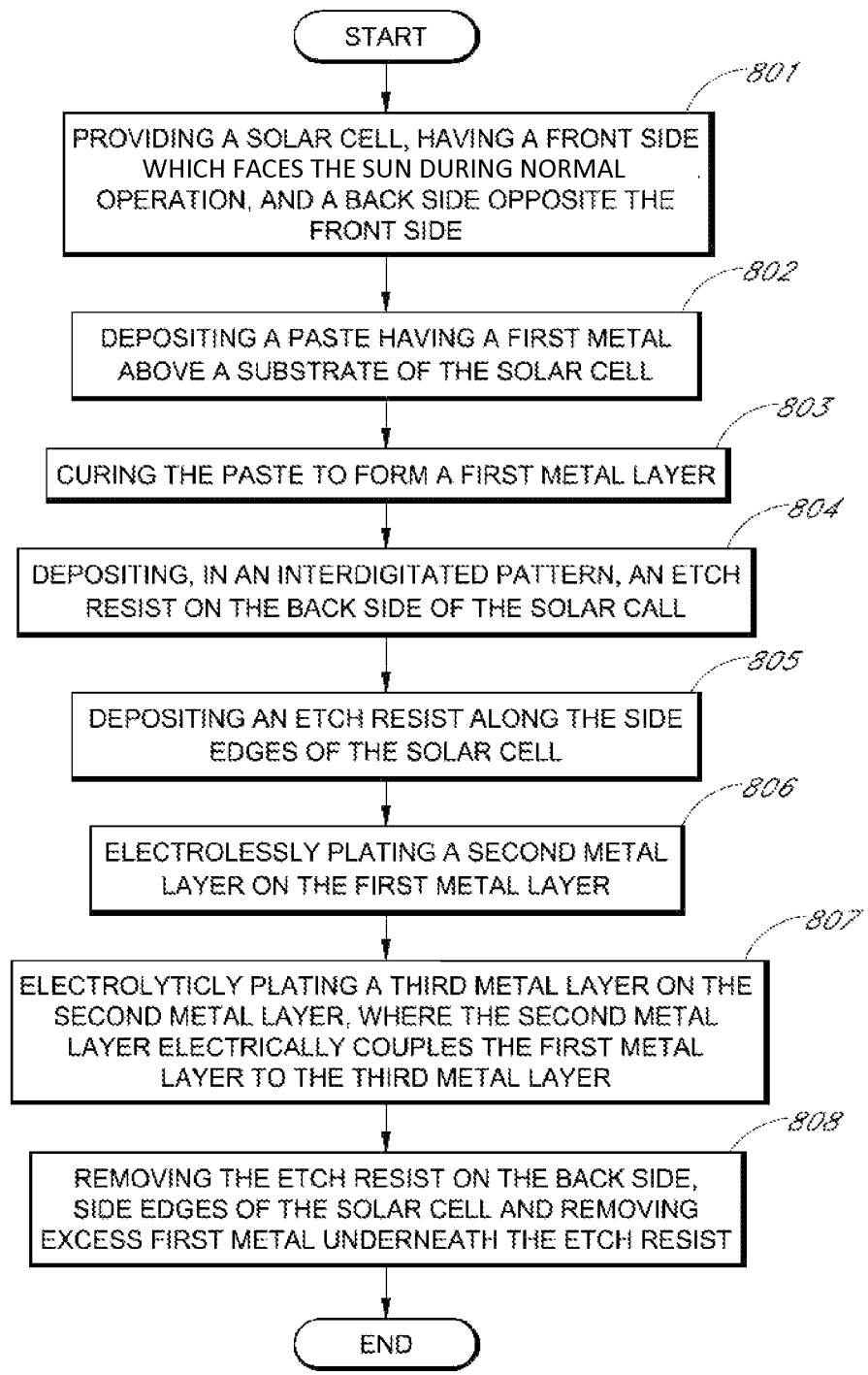
FIGS. 30-37 are flow charts of methods for forming contact regions of solar cells in accordance with methods for forming a contact region of a solar cell.

FIG. 30 illustrates a flow chart of an embodiment for forming contact regions on a solar cell. As described above, the first operation 801 can include providing a solar cell 300, having a front side 304 which faces the sun during normal operation, and a back side 302 opposite the front side 304. The second operation 802 can include depositing a paste having a first metal 330 above a substrate or a silicon substrate 310 of the solar cell 300. The third operation 803 can include curing 340 the paste to form a first metal layer 336. The fourth operation 804 can include depositing, in an interdigitated pattern, an etch resist ink 342 on the back side 302 of the solar cell 300. The fifth operation 805 can include depositing an etch resist 344 along the side edges of the solar cell 300. The sixth operation 806 can include electrolessly plating a second metal layer 350 on the first metal layer 336. The seventh operation 807 can include electrolytically plating a third metal layer 360 on the second metal layer 350, where the second metal layer 350 electrically couples the first metal layer 336 to the third metal layer 360. The last operation 808 can include removing the etch resist 342, 344 on the back side 302 and side edges of the solar cell 300 and removing excess metal underneath the etch resist 342, 344.

Figure 31:
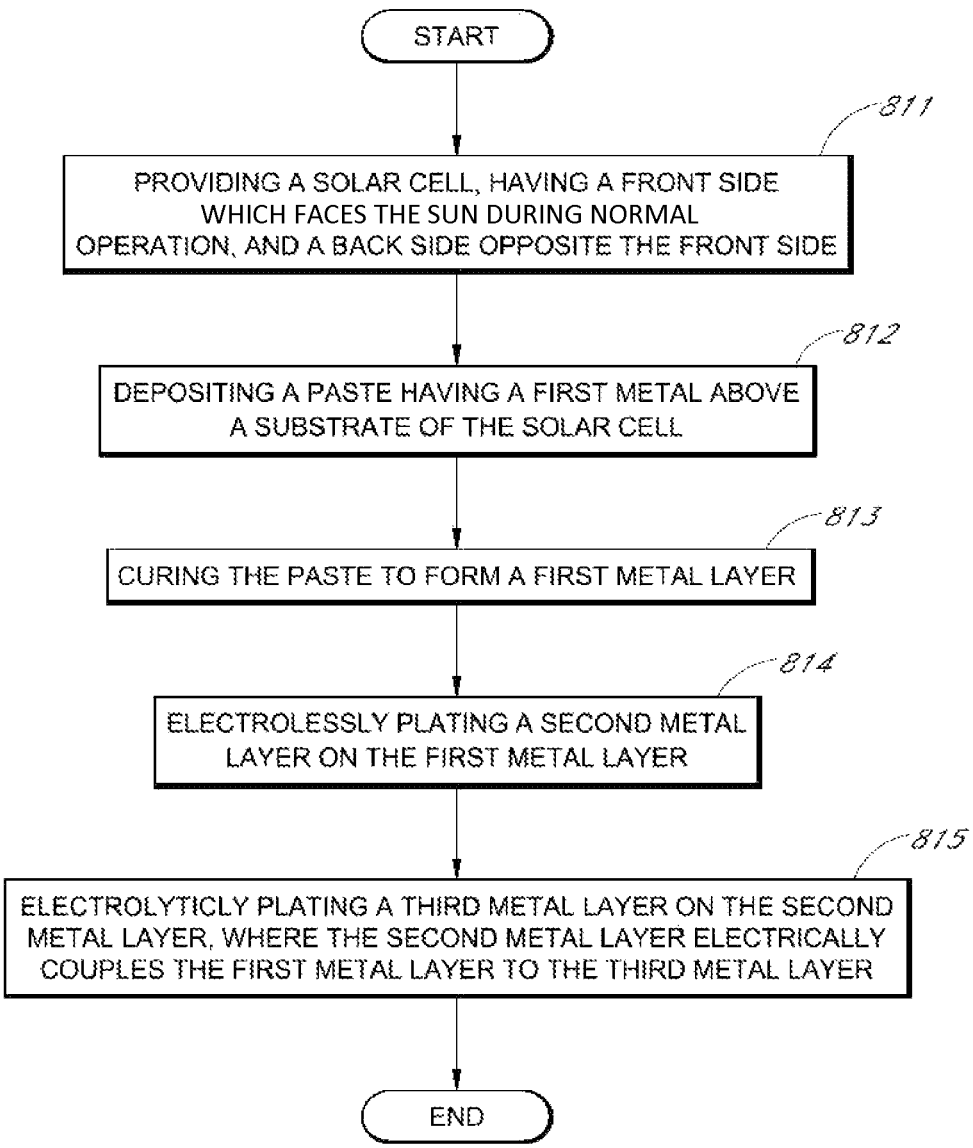

With reference to FIG. 31, a flow chart of another embodiment for forming contact regions on a solar cell 300 is shown. As described above, the first operation 811 can include providing a solar cell 300, having a front side 304 which faces the sun during normal operation, and a back side 302 opposite the front side 304. The second operation 812 can include depositing a paste having a first metal 330 above a substrate or silicon substrate 310 of the solar cell 300. The third operation 813 can include curing 340 the paste to form a first metal layer 336. The fourth operation 814 can include electrolessly plating a second metal layer 350 on the first metal layer 336. The last operation 815 can include electrolytically plating a third metal layer 360 on the second metal layer 350, where the second 350 layer electrically couples the first metal layer 336 to the third metal layer 360.

Figure 32:
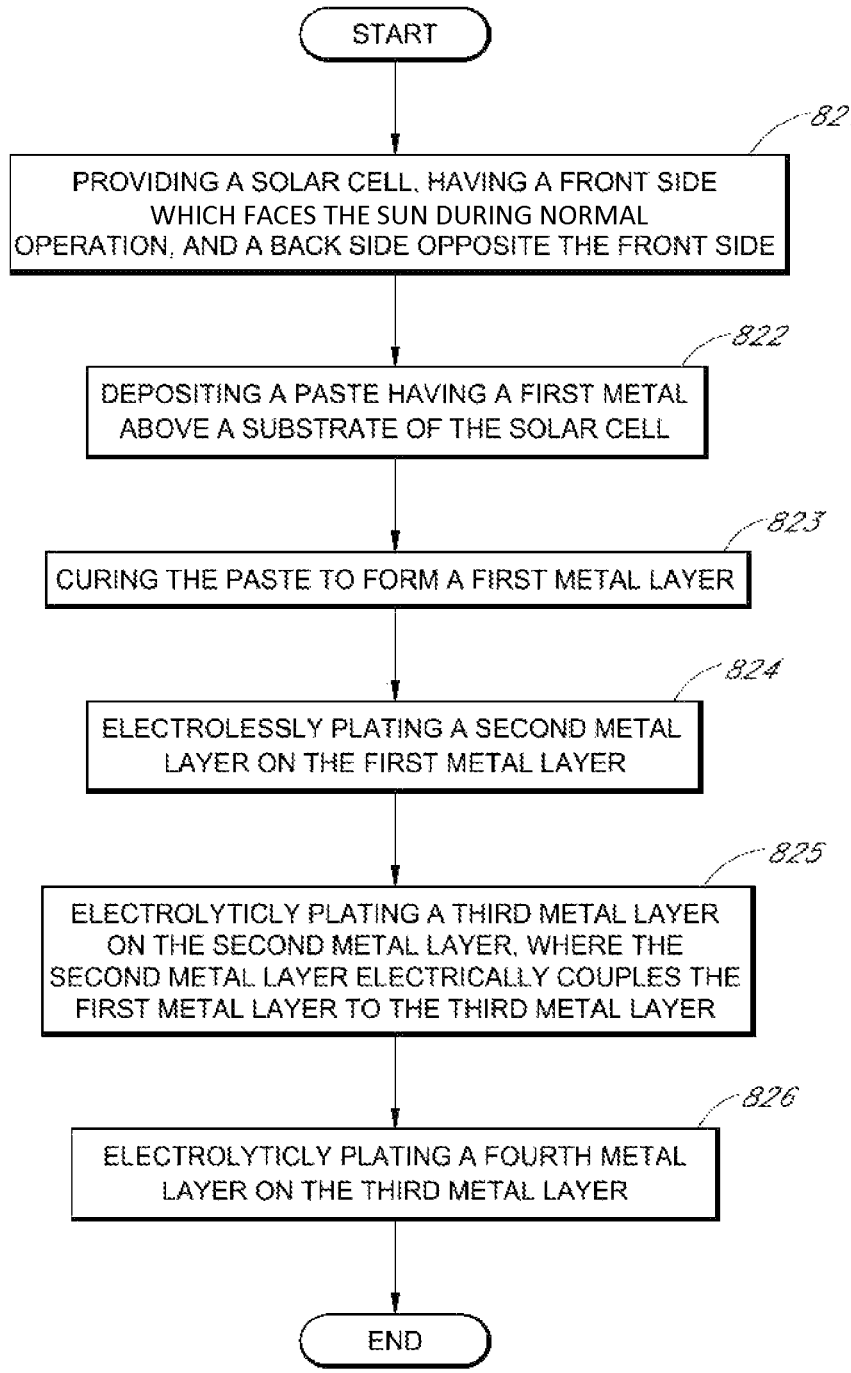

FIG. 32 illustrates a flow chart of still another embodiment for forming contact regions on a solar cell 300. As described above, the first operation 821 can include providing a solar cell 300, having a front side 304 which faces the sun during normal operation, and a back side 302 opposite the front side 304. The second operation 822 can include depositing a paste having a first metal 330 above a substrate or silicon substrate 310 of the solar cell 300. The third operation 823 can include curing 340 the paste to form a first metal layer 336. The fourth operation 824 can include electrolessly plating a second metal layer 350 on the first metal layer 336. The fifth operation 825 can include electrolytically plating a third metal layer 360 on the second metal layer 350, where the second metal layer 350 electrically couples the first metal layer 336 to the third metal layer 360. The last operation 826 can include electrolytically plating a fourth metal layer 362 on the third metal layer 360.

Figure 33:
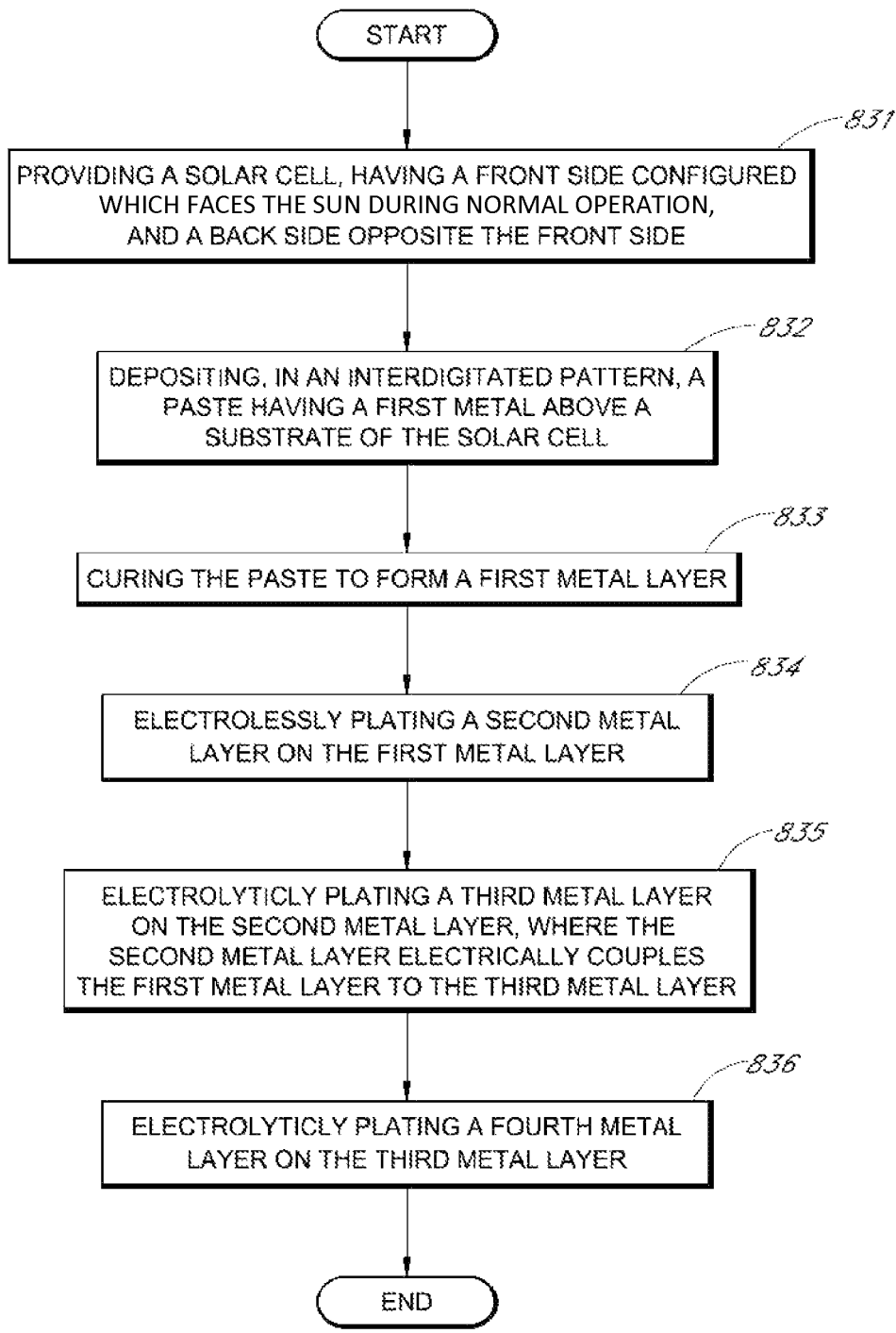

With reference to FIG. 33, a flow chart of yet another embodiment for forming contact regions on a solar cell 400 is shown. As described above, the first operation 831 can include providing a solar cell 400, having a front side 404 which faces the sun during normal operation, and a back side 402 opposite the front side 404. The second operation 832 can include depositing, in an interdigitated pattern, a paste having a first metal 430 above a substrate of the solar cell 400. The third operation 833 can include curing 440 the aluminum paste 430 to form a first metal layer 436. The fourth operation 834 can include electrolessly plating a second metal layer 450 on the first metal layer 436. The fifth operation 835 can include electrolytically plating a third metal layer 460 on the second metal layer 450, where the second metal layer 450 electrically couples the first metal layer 436 to the third metal layer 460. The last operation 836 can include electrolytically plating a fourth metal layer 462 on the third metal layer 460.

Figure 34:
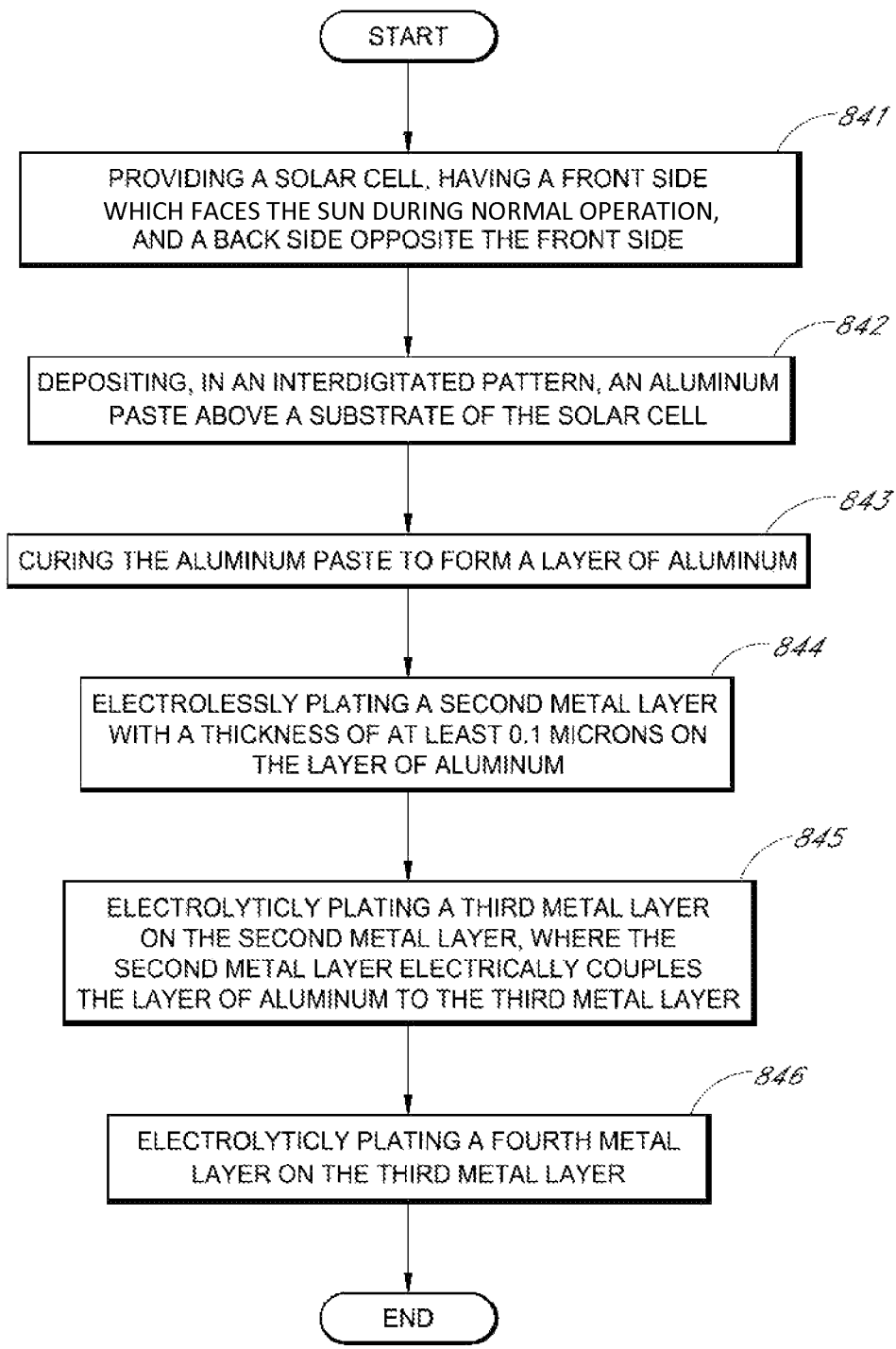

FIG. 34 illustrates a flow chart of yet another embodiment for forming contact regions on a solar cell 400. As described above, the first operation 841 can include providing a solar cell 400, having a front side 404 which faces the sun during normal operation, and a back side 402 opposite the front side 404. The second operation 842 can include depositing, in an interdigitated pattern, an aluminum paste 430 above a substrate of the solar cell 400. The third operation 843 can include curing 440 the aluminum paste 430 to form a layer of aluminum 436. The fourth operation 844 can include electrolessly plating a second metal layer 450 with a thickness of at least 0.1 microns on the layer of aluminum 436. The fifth operation 845 can include electrolytically plating a third metal layer 460 on the second metal layer 450, where the second metal layer 450 electrically couples the layer of aluminum 436 to the third metal layer 460. The last operation 846 can include electrolytically plating a fourth metal layer 462 on the third metal layer 460.

Figure 35:
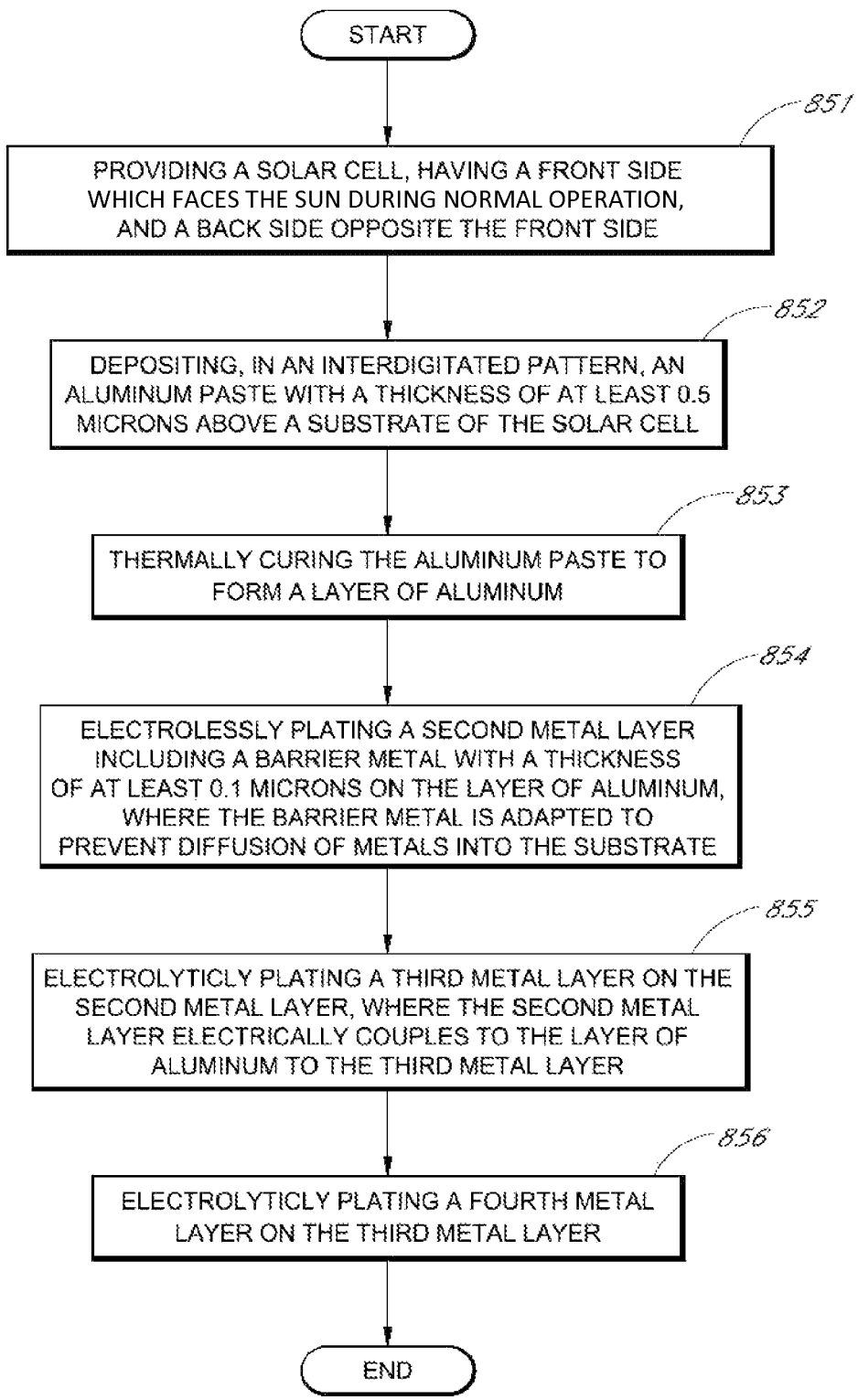

With reference to FIG. 35, a flow chart of an embodiment for forming contact regions on a solar cell 400 is shown. As described above, the first operation 851 can include providing a solar cell 400, having a front side 404 which faces the sun during normal operation, and a back side 402 opposite the front side 404. The second operation 852 can include depositing, in an interdigitated pattern, an aluminum paste 430 with a thickness of at least 0.5 microns above a substrate or a silicon substrate 410 of the solar cell 400. The third operation 853 can include thermally curing 440 the aluminum paste 430 to form a layer of aluminum 436. The fourth operation 854 can include electrolessly plating a second metal layer 450 including a barrier metal with a thickness of at least 0.1 microns on the layer of aluminum 436, where the barrier metal is adapted to prevent diffusion of metals into the substrate or silicon substrate 410. The fifth operation 855 can include electrolytically plating a third metal layer 460 on the second metal layer 450, where the second metal layer 450 electrically couples the layer of aluminum 436 to the third metal layer 460. The last operation 856 can include electrolytically plating a fourth metal layer 462 on the third metal layer 460.

Figure 36:
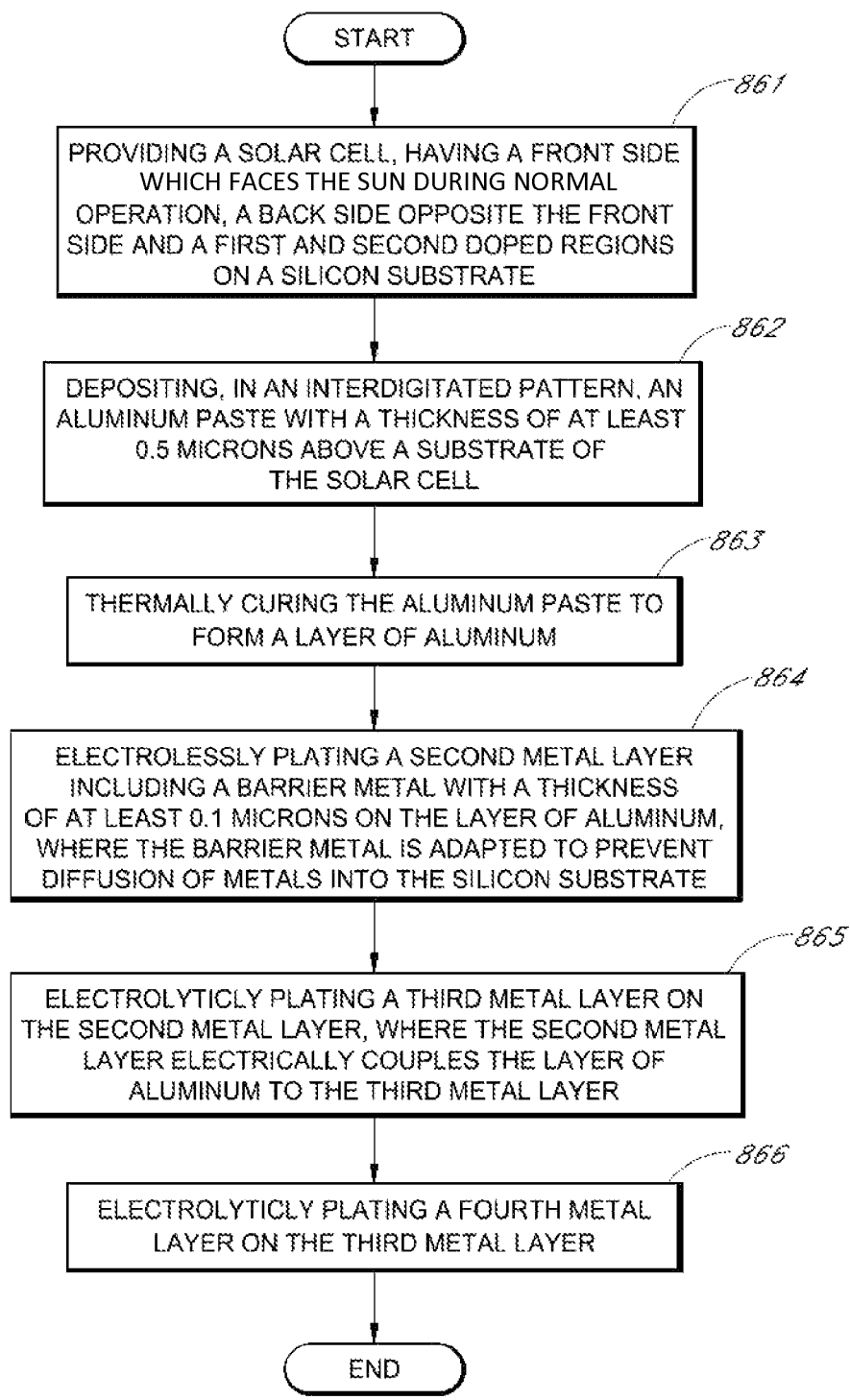

FIG. 36 illustrates a flow chart of another embodiment for forming contact regions on a solar cell 400. As described above, the first operation 861 can include providing a solar cell 400, having a front side 404 which faces the sun during normal operation, a back side 402 opposite the front side 404 and a first and second doped regions 412, 414 on a silicon substrate 410. The second operation 862 can include depositing, in an interdigitated pattern, an aluminum paste 430 with a thickness of at least 0.5 microns above a substrate 410 of the solar cell 400. The third operation 863 operation can include thermally curing 440 the paste to form a layer of aluminum 436. The fourth operation 864 can include electrolessly plating a second metal layer 450 including a barrier metal with a thickness of at least 0.1 microns on the layer of aluminum 436, where the barrier metal is adapted to prevent diffusion of metals into the substrate or silicon substrate 410. The fifth operation 865 can include electrolytically plating a third metal layer 460 on the second metal layer 450, where the second metal layer 450 electrically couples the layer of aluminum 436 to the third metal layer 460. The last operation 866 can include electrolytically plating a fourth metal 462 layer on the third metal layer 460.

Figure 37:
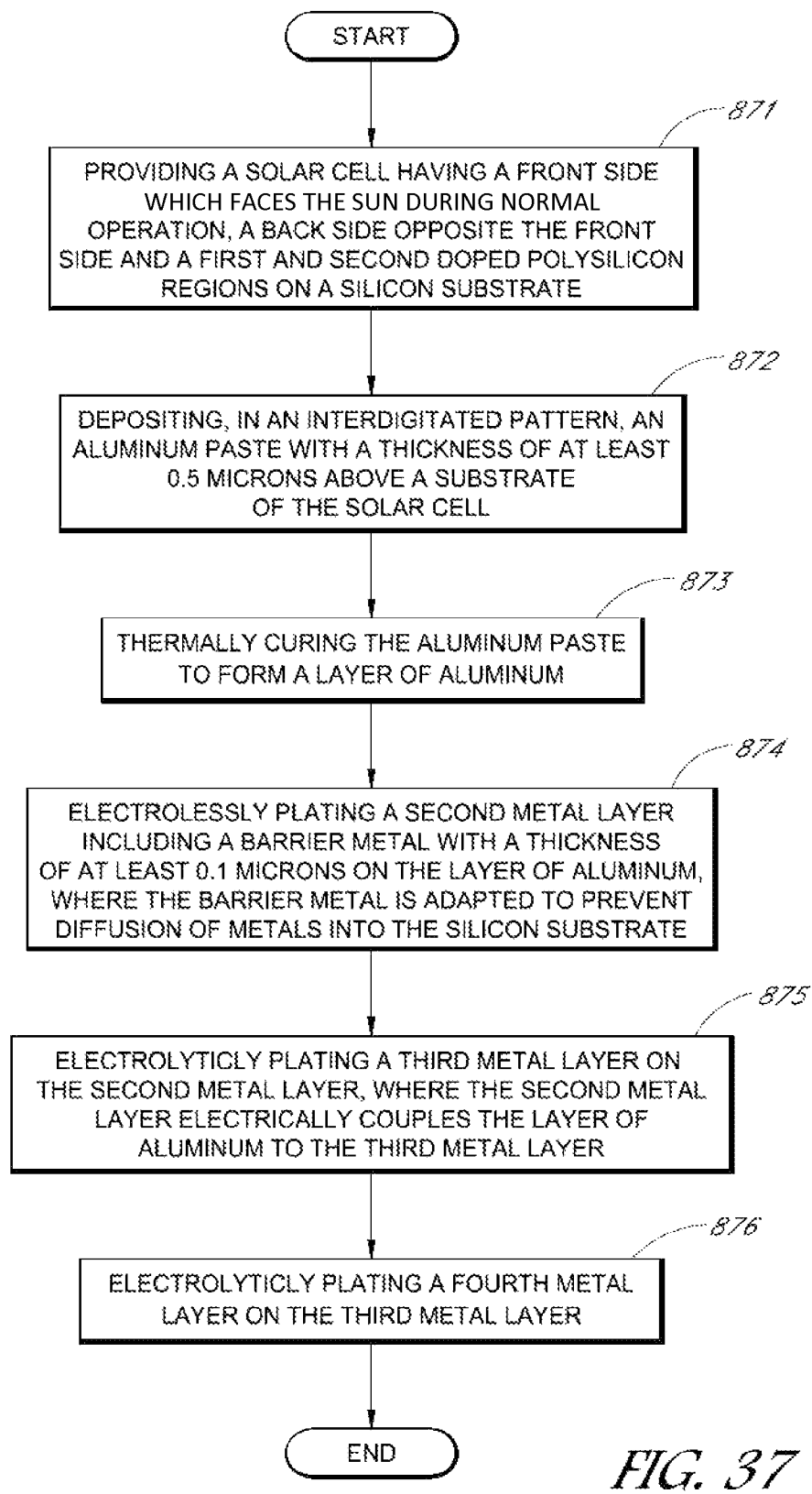

With reference to FIG. 37, a flow chart of still another embodiment for forming contact regions on a solar cell 500 is shown. As described above, the first operation 871 can include providing a solar cell 500, having a front side 504 which faces the sun during normal operation, a back side 502 opposite the front side 504 and a first and second doped polysilicon regions 512, 514 on a silicon substrate 510. The second operation 872 can include depositing, in an interdigitated pattern, an aluminum paste 530 with a thickness of at least 0.5 microns above a substrate or a silicon substrate 510 of the solar cell 500. The third operation 873 can include thermally curing 540 the aluminum paste 530 to form a layer of aluminum 536. The fourth operation 874 can include electrolessly plating a second metal layer 550 including a barrier metal with a thickness of at least 0.1 microns on the layer of aluminum 536, where the barrier metal is adapted to prevent diffusion of metals into the substrate or silicon substrate 510. The fifth operation 875 can include electrolytically plating a third metal layer 560 on the second metal layer 550, where the second metal layer 550 electrically couples the layer of aluminum 536 to the third metal layer 560. The last operation 876 can include electrolytically plating a fourth metal layer 562 on the third metal layer 560.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for forming a contact region for a solar cell, the solar cell having a front side which faces the sun during normal operation, and a back side opposite the front side, the method comprising:
   depositing a paste comprising a first metal above a substrate of the solar cell;
   curing the paste to form a first metal layer;
   electrolessly plating a second metal layer on the first metal layer; and
   electrolytically plating a third metal layer on the second metal layer, wherein the second metal layer electrically couples the first metal layer to the third metal layer.

2. The method of claim 1, wherein depositing the paste above the substrate comprises depositing paste on a polysilicon region above the substrate.

3. The method of claim 1, wherein depositing the paste comprises depositing an aluminum paste.

4. The method of claim 3, wherein depositing the aluminum paste comprises depositing an aluminum paste having a thickness of at least 0.5 microns.

5. The method of claim 1, wherein the second metal layer comprises a barrier metal adapted to prevent diffusion of metals from the third metal layer into the substrate.

6. The method of claim 1, wherein electrolessly plating the second metal layer comprises electrolessly plating a metal selected from the group consisting of nickel, gold, silver, rhodium, chromium, zinc, tin and cadmium.

7. The method of claim 1, wherein electrolessly plating the second metal layer comprises electrolessly plating a metal layer having a thickness of at least 0.1 microns.

8. The method of claim 1, wherein electrolytically plating the third metal layer comprises electrolytically plating a metal selected from the group consisting of copper, tin, aluminum, silver, gold, chromium, iron, nickel, zinc, ruthenium, palladium, and platinum.

9. The method of claim 1, further comprising: electrolytically plating a fourth metal layer on the third metal layer.

10. The method of claim 9, wherein electrolytically plating the fourth metal layer comprises electrolytically plating a metal selected from the group consisting of copper, tin, aluminum, silver, gold, chromium, iron, nickel, zinc, ruthenium, palladium, and platinum.

11. A method for forming a contact region for a solar cell, the solar cell having a front side which faces the sun during normal operation, and a back side opposite the front side, the method comprising:
   depositing, in an interdigitated pattern, an aluminum paste above a substrate of the solar cell;
   curing the aluminum paste to form a layer of aluminum;
   electrolessly plating a second metal layer with a thickness of at least 0.1 microns on the layer of aluminum;
   electrolytically plating a third metal layer on the second metal layer, wherein the second metal layer electrically couples the layer of aluminum to the third metal layer; and
   electrolytically plating a fourth metal layer on the third metal layer.

12. The method of claim 11, wherein depositing aluminum paste comprises depositing aluminum paste having a thickness of at least 0.5 microns.

13. The method of claim 11, wherein the second metal layer comprises a barrier metal adapted to prevent diffusion of metals from the third metal layer into the substrate.

14. The method of claim 11, wherein depositing the aluminum paste above the substrate comprises depositing aluminum paste on a polysilicon region above the substrate.

15. The method of claim 11, wherein depositing the aluminum paste comprises depositing using a method selected from the group consisting of screen printing, spin coating, and ink-jet printing.

16. The method of claim 11, wherein electrolytically plating the third and fourth metal layers comprises electrolytically plating metals selected from the group consisting of copper, tin, aluminum, silver, gold, chromium, iron, nickel, zinc, ruthenium, palladium, and platinum.

17. A method for forming a contact region for a solar cell, the solar cell having a front side which faces the sun during normal operation, and a back side opposite the front side, the method comprising:

depositing, in an interdigitated pattern, an aluminum paste with a thickness of at least 0.5 microns above a substrate of the solar cell;
thermally curing the aluminum paste to form a layer of aluminum;
electrolessly plating a second metal layer comprising a barrier metal with a thickness of at least 0.1 microns on the layer of aluminum, wherein the barrier metal is adapted to prevent diffusion of metals into the substrate;
electrolytically plating a third metal layer on the second metal layer, wherein the second metal layer electrically couples the layer of aluminum to the third metal layer; and
electrolytically plating a fourth metal layer on the third metal layer.

18. The method of claim 17, wherein depositing the aluminum paste above the substrate comprises depositing aluminum paste on a polysilicon region above the substrate.

19. The method of claim 17, wherein depositing the aluminum paste on the solar cell comprises depositing aluminum paste on the solar cell using a method selected from the group consisting of screen printing, spin coating, and ink-jet printing.

20. The method of claim 17, wherein the solar cell comprises a solar cell selected from the group consisting of a back-contact solar cell, a front-contact solar cell, a monocrystalline silicon solar cell, a polycrystalline silicon solar cell, an amorphous silicon solar cell, a thin film silicon solar cell, a copper indium gallium selenide (CIGS) solar cell, and a cadmium telluride solar cell.

* * * * *